(12) United States Patent
Mammou et al.

(10) Patent No.: US 11,454,710 B2
(45) Date of Patent: Sep. 27, 2022

(54) POINT CLOUD COMPRESSION USING A SPACE FILLING CURVE FOR LEVEL OF DETAIL GENERATION

(71) Applicant: Apple Inc., Cupertino, CA (US)

(72) Inventors: Khaled Mammou, Vancouver (CA); Alexandros Tourapis, Los Gatos, CA (US); Jungsun Kim, San Jose, CA (US)

(73) Assignee: Apple Inc., Cupertino, CA (US)

( * ) Notice: Subject to any disclaimer, the term of this patent is extended or adjusted under 35 U.S.C. 154(b) by 338 days.

(21) Appl. No.: 16/736,703

(22) Filed: Jan. 7, 2020

(65) Prior Publication Data

US 2020/0217937 A1 Jul. 9, 2020

Related U.S. Application Data

(60) Provisional application No. 62/789,986, filed on Jan. 8, 2019.

(51) Int. Cl.

| G01S 7/4861 | (2020.01) |
| G01S 17/42 | (2006.01) |
| H03M 7/30 | (2006.01) |

(52) U.S. Cl.
CPC .......... G01S 7/4861 (2013.01); G01S 17/42 (2013.01); H03M 7/3062 (2013.01)

(58) Field of Classification Search
CPC ........ G01S 7/4861; G01S 17/42; G01S 17/89; H03M 7/3062; G06T 2207/10028; G06T 9/004; G06T 9/001; H04N 19/593
See application file for complete search history.

(56) References Cited

U.S. PATENT DOCUMENTS 8,040,355 B2 * 10/2011 Burley .................... G06T 15/04
345/428
8,780,112 B2 7/2014 Kontkanen et al.
(Continued)

OTHER PUBLICATIONS

International Search Report and written opinion from PCT/US2020/012794, dated Apr. 14, 2020, pp. 1-19.
(Continued)

*Primary Examiner* — Khai M Nguyen
(74) *Attorney, Agent, or Firm* — Alexander A. Knapp; Kowert, Hood, Munyon, Rankin & Goetzel, P.C.

(57) ABSTRACT

A system comprises an encoder configured to compress attribute information for a point cloud and/or a decoder configured to decompress compressed attribute information. Attribute values for at least one starting point are included in a compressed attribute information file and attribute correction values are included in the compressed attribute information file. An order for the points is determined based on a space filling curve, wherein an encoder and a decoder determine a same order for the points based on the space filling curve. Levels of detail are determined by sampling the ordered points according to different sampling parameters, and attribute values are predicted for the points in the levels of detail using the determined order. The encoder determines attribute correction values based on a comparison of the predicted values to an original value prior to compression. The decoder corrects the predicted attribute values based on received attribute correction values.

20 Claims, 21 Drawing Sheets

(56) References Cited

U.S. PATENT DOCUMENTS

| | | | |
|---|---|---|---|
| 8,884,953 | B2 | 11/2014 | Chen et al. |
| 9,064,311 | B2 | 6/2015 | Mammou et al. |
| 9,171,383 | B2 | 10/2015 | Ahn et al. |
| 9,753,124 | B2 * | 9/2017 | Hayes .................. G01S 7/48 |
| 10,762,667 | B2 | 9/2020 | Mekuria |
| 2018/0268570 | A1 | 9/2018 | Budagavi et al. |
| 2019/0197739 | A1 | 6/2019 | Sinharoy et al. |
| 2019/0318488 | A1 | 10/2019 | Lim et al. |
| 2020/0005518 | A1 | 1/2020 | Graziosi |
| 2020/0027248 | A1 | 1/2020 | Verschaeve et al. |
| 2020/0153885 | A1 | 5/2020 | Lee et al. |
| 2020/0219285 | A1 | 7/2020 | Faramarzi et al. |
| 2020/0286261 | A1 | 9/2020 | Faramarzi et al. |
| 2020/0302578 | A1 | 9/2020 | Graziosi |

OTHER PUBLICATIONS

Remi Cura et al., "Implicit Lod for Processing and Classification in Point Cloud Servers", dated Mar. 4, 2016, pp. 1-18.

Yan Huang et al., "Octree-Based Progressive Geometry Coding of Point Clouds", dated Jan. 1, 2006, pp. 1-10.

Khaled Mammou, et al., "G-PCC codec description v1", International Organisation for Standardisation, ISO/IEC JTC1/SC29/WG11, Oct. 2018, pp. 1-32.

Sebastian Schwarz, et al., "Emerging MPEG Standards for Point Cloud Compression", IEEE Journal on Emerging and Selected Topics In Circuits and Systems, vol. 9, No. 1, Mar. 2019, pp. 133-148.

Li Li, et al., Efficient Projected Frame Padding for Video-based Point Cloud Compression, IEEE Transactions on Multimedia, doi: 10.100/TMM.2020.3016894, 2020, pp. 1-14.

Lujia Wang, et al., "Point-cloud Compression Using Data Independent Method—A 3D Discrete Cosine Transform Approach", in Proceedings of the 2017 IEEE International Conference on Information and Automation (ICIA), Jul. 2017, pp. 1-6.

Ismael Daribo, et al., "Efficient Rate-Distortion Compression on Dynamic Point Cloud for Grid-Pattern-Based 3D Scanning Systems", 3D Research 3.1, Springer, 2012, pp. 1-9.

Yiting Shao, et al., "Attribute Compression of 3D Point Clouds Using Laplacian Sparsity Optimized Graph Transform", 2017 IEEE Visual Communications and Image Processing (VCIP), IEEE, 2017, p. 1-4.

Siheng Chen, etaL, "Fast Resampling of 3D Point Clouds via Graphs", arX1v:1702.06397v1, Feb. 11, 2017, pp. 1-15.

Nahid Sheikhi Pour, "Improvements for Projection-Based Point Cloud Compression", MS Thesis, 2018, pp. 1-75.

Robert Skupin, et al., "Multiview Point Cloud Filtering for Spatiotemporal Consistency", VISAPP 2014—International Conference on Computer Vision Theory and Applications, 2014, pp. 531-538.

Sebastian Schwarz, et al., "Emergin MPEG Standards for Point Cloud Compression", IEEE Journal on Emerging and Selected Topics In Circuits and Systems, vol. 9, No. 1, Mar. 2019, pp. 133-148.

* cited by examiner

Compressed Attribute Information File — 1000

| |
|---|
| Configuration Information — 1002<br>K   (Number of nearest neighbors to identify)<br>C   (Context encoding configuration(s))<br>AI  (Additional configuration information) |
| LOD 1 Sampling Parameters — 1004<br>R   (Sampling Rate)<br>OD (Sampling Order)<br>OV (Sampling Offset Value) |
| LOD1 Compressed Attribute Information — 1006<br>Attribute Information for Starting Points<br>$(X_A, Y_A, Z_A; A_{1A}, A_{2A}, A_{3A},); (Point\ N, A_{1N}, A_{2N}, A_{3N},), ...$ |
| LOD1 Point Attribute Correction Values — 1008<br>Point A            Attribute 1 — +1<br>                         Attribute 2 — −1<br>                         Attribute 3 —   0<br><br>Point B            Attribute 1 — +2<br>                         Attribute 2 — −2 |
| LOD 2 Sampling Parameters — 1010<br>R   (Sampling Rate)<br>OD (Sampling Order)<br>OV (Sampling Offset Value) |
| LOD2 Compressed Attribute Information — 1012<br>Attribute Information for Starting Points<br>$(X_{AA}, Y_{AA}, Z_{AA}; A_{1AA}, A_{2AA}, A_{3AA},); (Point\ N, A_{1NN}, A_{2NN}, A_{3NN},), ...$ |
| LOD2 Point Attribute Correction Values — 1014<br>Point A            Attribute 1 — +2<br>                         Attribute 2 — −1<br>                         Attribute 3 — −2<br><br>Point B            Attribute 1 — +3<br>                         Attribute 2 — −2<br>                         . . . |

FIG. 10

POINT CLOUD COMPRESSION USING A SPACE FILLING CURVE FOR LEVEL OF DETAIL GENERATION

PRIORITY CLAIM

This application claims benefit of priority to U.S. Provisional Application Ser. No. 62/789,986, entitled "Point Cloud Compression Using a Space Filling Curve for Level of Detail Generation," filed Jan. 8, 2019, and which is incorporated herein by reference in its entirety.

BACKGROUND

Technical Field

This disclosure relates generally to compression and decompression of point clouds comprising a plurality of points, each having associated attribute information.

Description of the Related Art

Various types of sensors, such as light detection and ranging (LIDAR) systems, 3-D-cameras, 3-D scanners, etc. may capture data indicating positions of points in three dimensional space, for example positions in the X, Y, and Z planes. Also, such systems may further capture attribute information in addition to spatial information for the respective points, such as color information (e.g. RGB values), intensity attributes, reflectivity attributes, motion related attributes, modality attributes, or various other attributes. In some circumstances, additional attributes may be assigned to the respective points, such as a time-stamp when the point was captured. Points captured by such sensors may make up a "point cloud" comprising a set of points each having associated spatial information and one or more associated attributes. In some circumstances, a point cloud may include thousands of points, hundreds of thousands of points, millions of points, or even more points. Also, in some circumstances, point clouds may be generated, for example in software, as opposed to being captured by one or more sensors. In either case, such point clouds may include large amounts of data and may be costly and time-consuming to store and transmit.

SUMMARY OF EMBODIMENTS

In some embodiments, a system includes one or more sensors configured to capture points that collectively make up a point cloud, wherein each of the points comprises spatial information identifying a spatial location of the respective point in 3D space and attribute information defining one or more attributes associated with the respective point. The system also include an encoder configured to compress the attribute information for the points. To compress the attribute information, the encoder is configured to assign an attribute value to at least one point of the point cloud based on the attribute information included in the captured point cloud. Additionally, the encoder is configured to, for each of respective other ones of the points of the point cloud, identify a set of neighboring points, determine a predicted attribute value for the respective point based, at least in part, on predicted or assigned attributes values for the neighboring points, and determine, based at least in part, on comparing the predicted attribute value for the respective point to the attribute information for the point included in the captured point cloud, an attribute correction value for the point. The encoder is further configured to encode the compressed attribute information for the point cloud, wherein the compressed attribute information comprises the assigned attribute value for the at least one point and data indicating, for the respective other ones of the points, the respective determined attribute correction values.

In some embodiments, to compress attribute information an encoder is configured to build a hierarchical level of detail (LOD) structure for a point cloud. For example, the encoder may be configured to determine points to be included in a first level of detail for compressed attribute information of the point cloud and determine points to be included in one or more additional levels of detail for the compressed attribute information of the point cloud. To determine the points to be included in the first level of detail or the points to be included in the one or more additional levels of detail, the encoder is configured to determine an ordering of the points of the point cloud based on a space filling curve, wherein respective points of the point cloud are assigned to an index that indexes the respective points based on proximities of the respective points to locations along the space filing curve. Further as part of determining the points to be included in the first level of detail or the points to be included in the one or more additional levels of detail, the encoder is configured to sample the index according to one or more sampling rates to determine points of the point cloud to be included in the first level of detail or the one or more additional levels of detail. Additionally, the encoder is configured to compress attribute information for the points determined to be included in the first level of detail and compress attribute information for the point determined to be included in the one or more additional levels of detail. For example, the encoder may generate attribute correction values for the points determined to be included in the first level of detail and for the points determined to be included in the one or more additional levels of detail. In some embodiments, a prediction and correction process as described above may be used to determine the attribute correction values for respective sets of points determined to be included in respective ones of the levels of detail.

In some embodiments, a decoder is configured to receive compressed attribute information for a point cloud comprising at least one assigned attribute value for at least one point of the point cloud and data indicating attribute correction values for attributes of other points of the point cloud. In some embodiments, the attribute correction values may be ordered in a plurality of levels of detail for a plurality of sub-sets of points of the point cloud. For example, the decoder may receive a compressed point cloud compressed by an encoder as described above. The decoder may further be configured to provide decompressed attribute information for a first level of detail and update a decompressed version of the point cloud to include attribute information for additional sub-sets of points at one or more other ones of a plurality of levels of detail.

In some embodiments, to decompress attribute information, a decoder is configured to receive spatial information for points of a point cloud and receive compressed attribute information for one or more levels of detail of the point cloud. The decoder is further configured to determine points to be included in the one or more levels of detail for the point cloud based on determining an ordering of the points of the point cloud based on a space filling curve, wherein respective points of the point cloud are assigned to an index that indexes the respective points based on proximities of the respective points to locations along the space filing curve and sampling the index according to one or more sampling rates to determine points of the point cloud to be included in the one or more levels of detail. Furthermore, the decoder is configured to determine attribute values for the points determined to be included in the one or more levels of detail based on the received compressed attribute information for the points of the respective one or more levels of detail of the point cloud. For example, the decoder may predict attribute values for the points included in a given level of detail and then apply attribute correction values to the predicted values, wherein the attribute correction values are included in compressed attribute information for the given level of detail.

In some embodiments, a non-transitory computer readable medium may store program instructions that, when executed by one or more processors, cause the one or more processors to determine levels of detail of a level of detail structure based on applying a space filing curve as described herein. Also, the program instructions may cause the one or more processors to encode or decode attribute information for a point cloud using the determined level of detail structure as described herein.

In some embodiments, a method includes determining levels of detail of a level of detail structure based on applying a space filing curve as described herein. The method may also include encoding or decoding attribute information for a point cloud using the level of detail structure as described herein.

BRIEF DESCRIPTION OF THE DRAWINGS

FIG. 10 illustrates an example compressed attribute file comprising compressed attribute information for multiple levels of detail (LODs) of a compressed point cloud, according to some embodiments.

Figure 1A:
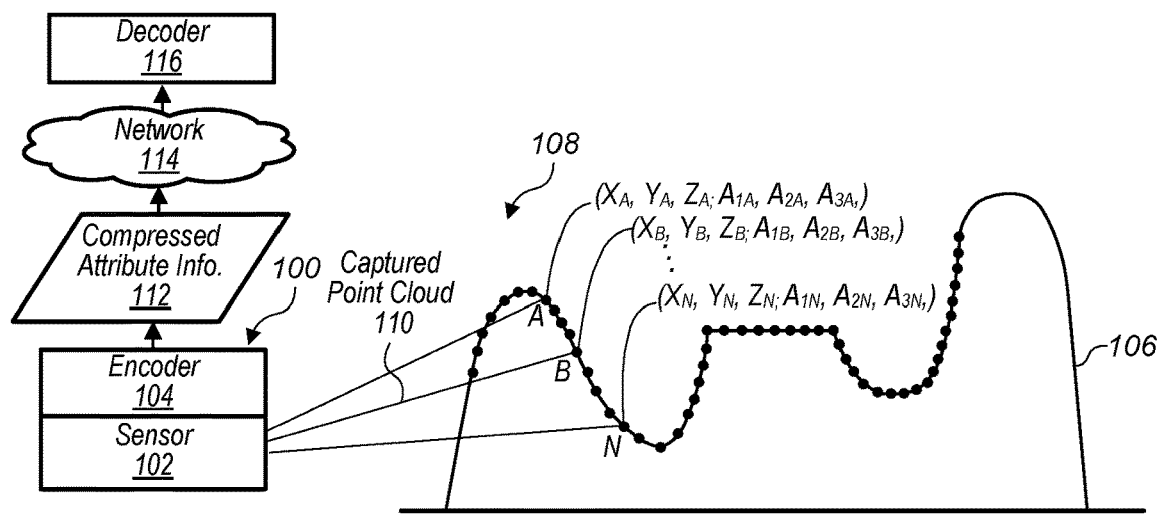
FIG. 1A illustrates a system comprising a sensor that captures information for points of a point cloud and an encoder that compresses attribute information and/or spatial information of the point cloud, where the compressed point cloud information is sent to a decoder, according to some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112(f), for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

As data acquisition and display technologies have become more advanced, the ability to capture point clouds comprising thousands or millions of points in 2-D or 3-D space, such as via LIDAR systems, has increased. Also, the development of advanced display technologies, such as virtual reality or augmented reality systems, has increased potential uses for point clouds. However, point cloud files are often very large and may be costly and time-consuming to store and transmit. For example, communication of point clouds over private or public networks, such as the Internet, may require considerable amounts of time and/or network resources, such that some uses of point cloud data, such as real-time uses, may be limited. Also, storage requirements of point cloud files may consume a significant amount of storage capacity of devices storing the point cloud files, which may also limit potential applications for using point cloud data.

In some embodiments, an encoder may be used to generate a compressed point cloud to reduce costs and time associated with storing and transmitting large point cloud files. In some embodiments, a system may include an encoder that compresses attribute information and/or spatial information (also referred to herein as geometry information) of a point cloud file such that the point cloud file may be stored and transmitted more quickly than non-compressed point clouds and in a manner such that the point cloud file may occupy less storage space than non-compressed point clouds. In some embodiments, compression of spatial information and/or attributes of points in a point cloud may enable a point cloud to be communicated over a network in real-time or in near real-time. For example, a system may include a sensor that captures spatial information and/or attribute information about points in an environment where the sensor is located, wherein the captured points and corresponding attributes make up a point cloud. The system may also include an encoder that compresses the captured point cloud attribute information. The compressed attribute information of the point cloud may be sent over a network in real-time time or near real-time to a decoder that decompresses the compressed attribute information of the point cloud. The decompressed point cloud may be further processed, for example to make a control decision based on the surrounding environment at the location of the sensor. The control decision may then be communicated back to a device at or near the location of the sensor, wherein the device receiving the control decision implements the control decision in real-time or near real-time. In some embodiments, the decoder may be associated with an augmented reality system and the decompressed attribute information may be displayed or otherwise used by the augmented reality system. In some embodiments, compressed attribute information for a point cloud may be sent with compressed spatial information for points of the point cloud. In other embodiments, spatial information and attribute information may be separately encoded and/or separately transmitted to a decoder. In some embodiments an encoder or a decoder may be implemented in hardware via processing circuits specifically designed to perform the encoding/decoding. In some embodiments, a device or system may include one or more processors and a memory that stores program instructions that cause the one or more processors to implement the encoder or decoder.

In some embodiments, a system may include a decoder that receives one or more point cloud files comprising compressed attribute information via a network from a remote server or other storage device that stores the one or more point cloud files. For example, a 3-D display, a holographic display, or a head-mounted display may be manipulated in real-time or near real-time to show different portions of a virtual world represented by point clouds. In order to update the 3-D display, the holographic display, or the head-mounted display, a system associated with the decoder may request point cloud files from the remote server based on user manipulations of the displays, and the point cloud files may be transmitted from the remote server to the decoder and decoded by the decoder in real-time or near real-time. The displays may then be updated with updated point cloud data responsive to the user manipulations, such as updated point attributes.

In some embodiments, a system, may include one or more LIDAR systems, 3-D cameras, 3-D scanners, etc., and such sensor devices may capture spatial information, such as X, Y, and Z coordinates for points in a view of the sensor devices. In some embodiments, the spatial information may be relative to a local coordinate system or may be relative to a global coordinate system (for example, a Cartesian coordinate system may have a fixed reference point, such as a fixed point on the earth, or may have a non-fixed local reference point, such as a sensor location).

In some embodiments, such sensors may also capture attribute information for one or more points, such as color attributes, reflectivity attributes, velocity attributes, acceleration attributes, time attributes, modalities, and/or various other attributes. In some embodiments, other sensors, in addition to LIDAR systems, 3-D cameras, 3-D scanners, etc., may capture attribute information to be included in a point cloud. For example, in some embodiments, a gyroscope or accelerometer, may capture motion information to be included in a point cloud as an attribute associated with one or more points of the point cloud. For example, a vehicle equipped with a LIDAR system, a 3-D camera, or a 3-D scanner may include the vehicle's direction and speed in a point cloud captured by the LIDAR system, the 3-D camera, or the 3-D scanner. For example, when points in a view of the vehicle are captured they may be included in a point cloud, wherein the point cloud includes the captured points and associated motion information corresponding to a state of the vehicle when the points were captured.

In some embodiments, attribute information may comprise string values, such as different modalities. For example attribute information may include string values indicating a modality such as "walking", "running", "driving", etc. In some embodiments, an encoder may comprise a "string-value" to integer index, wherein certain strings are associated with certain corresponding integer values. In some embodiments, a point cloud may indicate a string value for a point by including an integer associated with the string value as an attribute of the point. The encoder and decoder may both store a common string value to integer index, such that the decoder can determine string values for points based on looking up the integer value of the string attribute of the point in a string value to integer index of the decoder that matches or is similar to the string value to integer index of the encoder.

In some embodiments, an encoder compresses and encodes spatial information of a point cloud to compress the spatial information in addition to compressing attribute information for attributes of the points of the point cloud. For example, to compress spatial information a K-D tree may be generated wherein, respective numbers of points included in each of the cells of the K-D tree are encoded. This sequence of encoded point counts may encode spatial information for points of a point cloud. Also, in some embodiments, a sub-sampling and prediction method may be used to compress and encode spatial information for a point cloud. In some embodiments, the spatial information may be quantized prior to being compressed and encoded. Also, in some embodiments, compression of spatial information may be lossless. Thus, a decoder may be able to determine a same view of the spatial information as an encoder. Also, an encoder may be able to determine a view of the spatial information a decoder will encounter once the compressed spatial information is decoded. Because, both an encoder and decoder may have or be able to recreate the same spatial information for the point cloud, spatial relationships may be used to compress attribute information for the point cloud.

For example, in many point clouds, attribute information between adjacent points or points that are located at relatively short distances from each other may have high levels of correlation between attributes, and thus relatively small differences in point attribute values. For example, proximate points in a point cloud may have relatively small differences in color, when considered relative to points in the point cloud that are further apart.

In some embodiments, an encoder may include a predictor that determines a predicted attribute value of an attribute of a point in a point cloud based on attribute values for similar attributes of neighboring points in the point cloud and based on respective distances between the point being evaluated and the neighboring points. In some embodiments, attribute values of attributes of neighboring points that are closer to a point being evaluated may be given a higher weighting than attribute values of attributes of neighboring points that are further away from the point being evaluated. Also, the encoder may compare a predicted attribute value to an actual attribute value for an attribute of the point in the original point cloud prior to compression. A residual difference, also referred to herein as an "attribute correction value" may be determined based on this comparison. An attribute correction value may be encoded and included in compressed attribute information for the point cloud, wherein a decoder uses the encoded attribute correction value to correct a predicted attribute value for the point, wherein the attribute value is predicted using a same or similar prediction methodology at the decoder that is the same or similar to the prediction methodology that was used at the encoder.

In some embodiments, an encoder may assign an attribute value for a starting point of a point cloud to be used as a starting point in an evaluation order. An encoder may predict an attribute value for a next nearest point to the starting point based on the attribute value of the starting point and a distance between the starting point and the next nearest point. The encoder may then determine a difference between the predicted attribute value for the next nearest point and the actual attribute value for the next nearest point included in the non-compressed original point cloud. This difference may be encoded in a compressed attribute information file as an attribute correction value for the next nearest point. The encoder may then repeat a similar process for each point in the evaluation order. To predict the attribute value for subsequent points in the evaluation order, the encoder may identify the K-nearest neighboring points to a particular point being evaluated, wherein the identified K-nearest neighboring points have assigned or predicted attribute values. In some embodiments, "K" may be a configurable parameter that is communicated from an encoder to a decoder.

The encoder may determine a distance in X, Y, and Z space between a point being evaluated and each of the identified neighboring points. For example, the encoder may determine respective Euclidian distances from the point being evaluated to each of the neighboring points. The encoder may then predict an attribute value for an attribute of the point being evaluated based on the attribute values of the neighboring points, wherein the attribute values of the neighboring points are weighted according to an inverse of the distances from the point being evaluated to the respective ones of the neighboring points. For example, attribute values of neighboring points that are closer to the point being evaluated may be given more weight than attribute values of neighboring points that are further away from the point being evaluated.

In a similar manner as described for the first neighboring point, the encoder may compare a predicted value for each of the other points of the point cloud to an actual attribute value in an original non-compressed point cloud, for example the captured point cloud. The difference may be encoded as an attribute correction value for an attribute of one of the other points that is being evaluated. In some embodiments, attribute correction values may be encoded in an order in a compressed attribute information file in accordance with an evaluation order determined based on a space filling curve. Because the encoder and the decoder may determine the same evaluation order based on the spatial information for the point cloud, the decoder may determine which attribute correction value corresponds to which attribute of which point based on the order in which the attribute correction values are encoded in the compressed attribute information file. Additionally, the starting point and one or more attribute value(s) of the starting point may be explicitly encoded in a compressed attribute information file such that the decoder may determine the evaluation order starting with the same point as was used to start the evaluation order at the encoder. Additionally, the one or more attribute value(s) of the starting point may provide a value of a neighboring point that a decoder uses to determine a predicted attribute value for a point being evaluated that is a neighboring point to the starting point.

In some embodiments, an encoder may determine a predicted value for an attribute of a point based on temporal considerations. For example, in addition to or in place of determining a predicted value based on neighboring points in a same "frame" e.g. point in time as the point being evaluated, the encoder may consider attribute values of the point in adjacent and subsequent time frames.

FIG. 1A illustrates a system comprising a sensor that captures information for points of a point cloud and an encoder that compresses attribute information of the point cloud, where the compressed attribute information is sent to a decoder, according to some embodiments.

System 100 includes sensor 102 and encoder 104. Sensor 102 captures a point cloud 110 comprising points representing structure 106 in view 108 of sensor 102. For example, in some embodiments, structure 106 may be a mountain range, a building, a sign, an environment surrounding a street, or any other type of structure. In some embodiments, a captured point cloud, such as captured point cloud 110, may include spatial and attribute information for the points included in the point cloud. For example, point A of captured point cloud 110 comprises X, Y, Z coordinates and attributes 1, 2, and 3. In some embodiments, attributes of a point may include attributes such as R, G, B color values, a velocity at the point, an acceleration at the point, a reflectance of the structure at the point, a time stamp indicating when the point was captured, a string-value indicating a modality when the point was captured, for example "walking", or other attributes. The captured point cloud 110 may be provided to encoder 104, wherein encoder 104 generates a compressed version of the point cloud (compressed attribute information 112) that is transmitted via network 114 to decoder 116. In some embodiments, a compressed version of the point cloud, such as compressed attribute information 112, may be included in a common compressed point cloud that also includes compressed spatial information for the points of the point cloud or, in some embodiments, compressed spatial information and compressed attribute information may be communicated as separate files.

In some embodiments, encoder 104 may be integrated with sensor 102. For example, encoder 104 may be implemented in hardware or software included in a sensor device, such as sensor 102. In other embodiments, encoder 104 may be implemented on a separate computing device that is proximate to sensor 102.

Low-Complexity Level of Detail Generation Procedure

In some embodiments, an encoder, such as encoder 104 may utilize a level of detail generation procedure to determine multiple levels of detail for a point cloud, such as point cloud 106. Instead of predicting attribute values and determining attribute correction values for each point of a point cloud before encoding the determined attribute correction values, the encoder may instead predict attribute values and determine attribute correction values for points included a first level of detail and encode the determined attribute correction values prior to determining attribute correction values for all of the other points of the point cloud. The encoder may then predict attribute values and determine attribute correction values for other points included in other additional levels of detail for the point cloud and encode these determined attribute correction values subsequent to encoding attribute correction values for points included in lower levels of detail. This approach may allow a lower level of detail representation of a point cloud to be compressed, encoded and communicated more quickly than would be the case for the full point cloud. The lower level of detail representation may then be supplemented with compressed attribute information for additional levels of detail. This in turn may enable a decoder to more quickly reconstruct a lower level of detail representation of the point cloud and later supplement the lower level of detail representation to include more detail by adding in attribute values for points included in the other additional levels of detail.

In some embodiments, a level of detail (LOD) structure partitions a point cloud into non-overlapping subsets of points referred to as refinement levels, e.g. $(R_1)_{l=0 \ldots L-1}$. In some embodiments in which a distance-based approach is used to determine level of detail refinement levels, the refinement levels may be determined according to a set of Euclidian distances $(d_1)_{l=0 \ldots L-1}$ specified by the user, in a way, that the entire point cloud is represented by the union of all the refinements levels. A current level of detail 1, $(LOD)_1$, is obtained by taking the union of the refinement levels $R_0, R_1, \ldots, R_1$ as follows:

$LOD_0 = R_0$
$LOD_1 = LOD_0 \cup R_1 \ldots$
$LOD_1 = LOD_{(1-1)} \cup R_1 \ldots$
$LOD_{(L-1)} = LOD_{(L-2)} \cup R_{(L)}$ represents entire point cloud In some embodiments, in which points are selected to be included in a particular level of detail based on distances between the points, the points in each refinement level $R_1$ are extracted in such a way that the Euclidian distances between the points in that particular LOD are greater than or equal to a user defined threshold D. As the level-of-detail 1 increases, D decreases and more points are included in-between the points in the lower LOD, therefore increasing the point cloud reconstruction detail. Attributes of a point in $R_1$ are then predicted from k nearest-neighbor points in $LOD_{(1-1)}$. Finally, the prediction residue (e.g. the attribute correction values), i.e. the difference between actual and predicted values of attributes, is encoded using an entropy encoder, e.g. an arithmetic encoder.

A distance-based LOD generation process as described above tries to guarantee a uniform sampling throughout the different LODs. Such a strategy offers efficient prediction results for smooth attribute signals defined over uniformly or near uniformly sampled point clouds. However, it may lead to poor prediction results for non-smooth attribute signals defined over irregularly sampled point clouds. Moreover, the distance-based LOD generation process requires computing distances between each point and its neighbors, which in practice may be complex for certain use-case scenarios.

In some embodiments, as an alternative to the distance-based LOD generation process for encoding attribute values, a low-complexity LOD generation process that utilizes a space filling curve to order points and determine refinement levels may be used. The low-complexity LOD generation process using a space filling curve may enable a more efficient prediction for non-smooth attribute signals defined over irregularly sampled point clouds. In some embodiments, various additional features may be combined with a low-complexity LOD generation process that utilizes a space filling curve to order points and determine refinement levels, such as a combined ordering/sampling LOD method, an adaptive scanning mode, an adaptive offset mode, an attribute interleaving mode, an inter-attribute/cross-component prediction mode, a prediction adaptation mode, and/or a dependent LOD encoder optimization mode.

LOD Generation Using a Space Filling Curve

In some embodiments, a low-complexity LOD generation process that utilizes a space filling curve to order points and determine refinement levels may be used. The spatial information may be encoded using any technique for encoding spatial information, such as K-D trees, octree encoding, sub-sampling and inter-point prediction, etc. In this way both the encoder and the decoder may know the spatial locations of the points of the point cloud. However, instead of determining which points are to be included in respective refinement levels based on distances between the points as is described above, the points to be included in respective levels of details may be determined by ordering the points according to their location along a space filling curve. For example, the points may be organized according to their Morton codes. Alternatively, other space filling curves could be used. For example, techniques to map positions (e.g., in X, Y, Z coordinate form) to a space filling curve such as a Morton-order (or Z-order), Hillbert curve, Peano curve, and so on may be used. In this way all of the points of the point cloud that are encoded and decoded using the spatial information may be organized into an index in the same order at the encoder and the decoder.

Figure 1B:
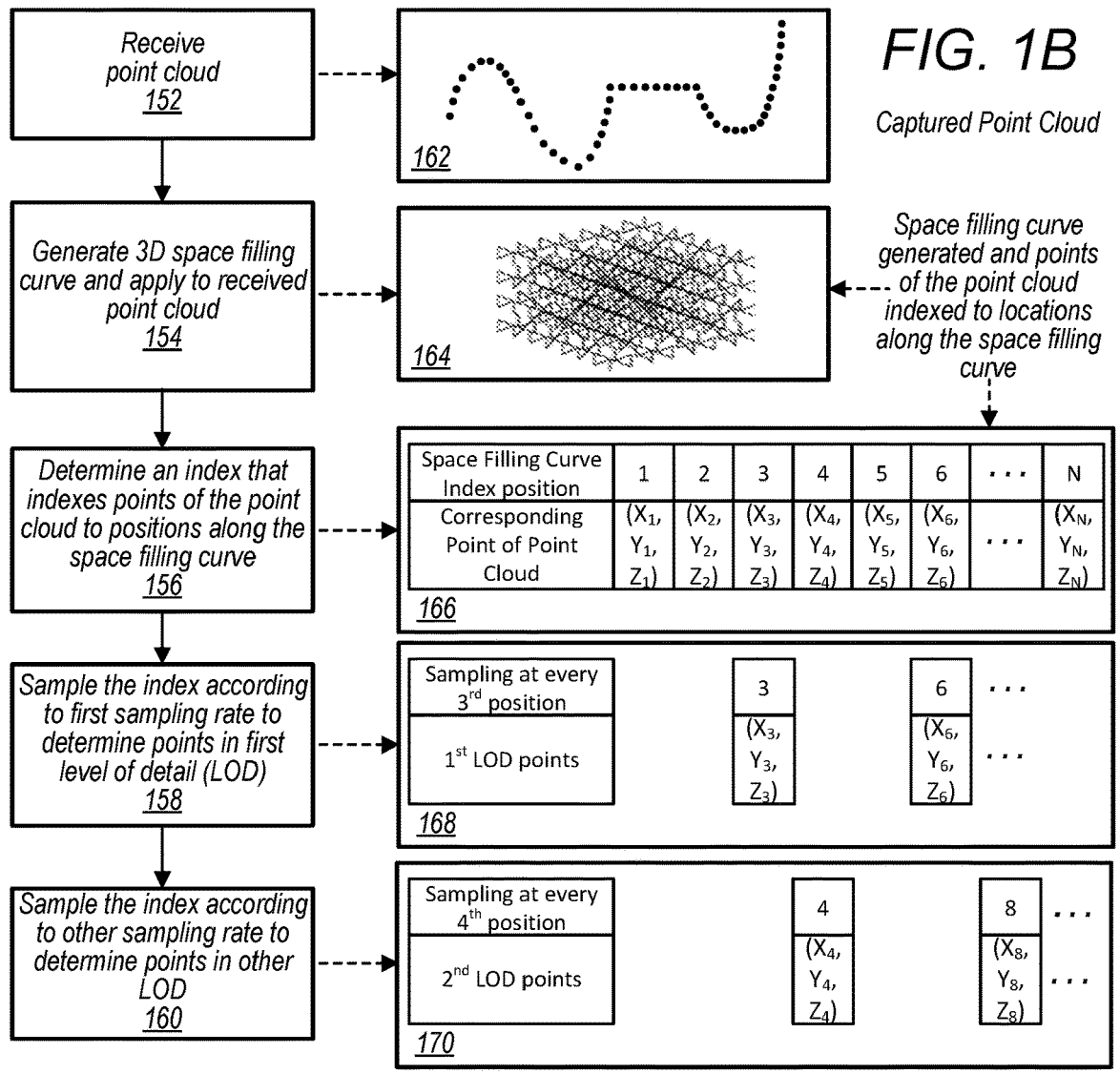
FIG. 1B illustrates a process for determining points to be included in levels of detail (LODs) for compressing/encoding attribute information of a point cloud, according to some embodiments.

For example, FIG. 1B illustrates a process for determining points to be included in levels of detail (LODs) for encoding attribute information of a point cloud, according to some embodiments.

At 152, an encoder receives a point cloud to be compressed, such as point cloud 162. The received point cloud may be a captured point cloud, such as a point cloud captured by sensor 102 or may be a point cloud generated in software, such as in a 3D software environment.

At 154, the encoder generates a 3D space filling curve and applies the 3D space filing curve to the received point cloud to determine corresponding locations along the space filling curve of the points of the received point cloud. For example, space filling curve 164 may be generated and points of point cloud 162 may be mapped to nearest locations of the space filling curve 164 that are proximate to the respective points of the point cloud.

At 156, the encoder determines an index for the point cloud that indexes the points of the point cloud based on proximities of the respective points to locations along the space filling curve. For example, index 166 illustrates points of point cloud 162 ordered in index positions 1-6 through N of index 166.

At 158, the determined index is sampled at a specified or known sampling rate to determine points of point cloud 162 to be included in a first level of detail (e.g. first refinement level). For example sampled index 168 illustrates index 166 sampled at a rate of "every $3^{rd}$ position" to determine points of the point cloud 162 to be included in the first refinement level/level of detail.

At 160, the determined index is sampled at a second specified or known sampling rate to determine points of the point cloud 162 to be included in a second refinement level that when combined with the points of lower levels of detail (e.g. the first level of detail) constitutes a second level of detail that is more detailed than the lower levels of detail. For example, sampled index 170 illustrates index 166 sampled at a rate of "every $4^{th}$ position" to determine points of the point cloud 162 to be included in the second refinement level/level of detail.

Figures 1C, 1D:
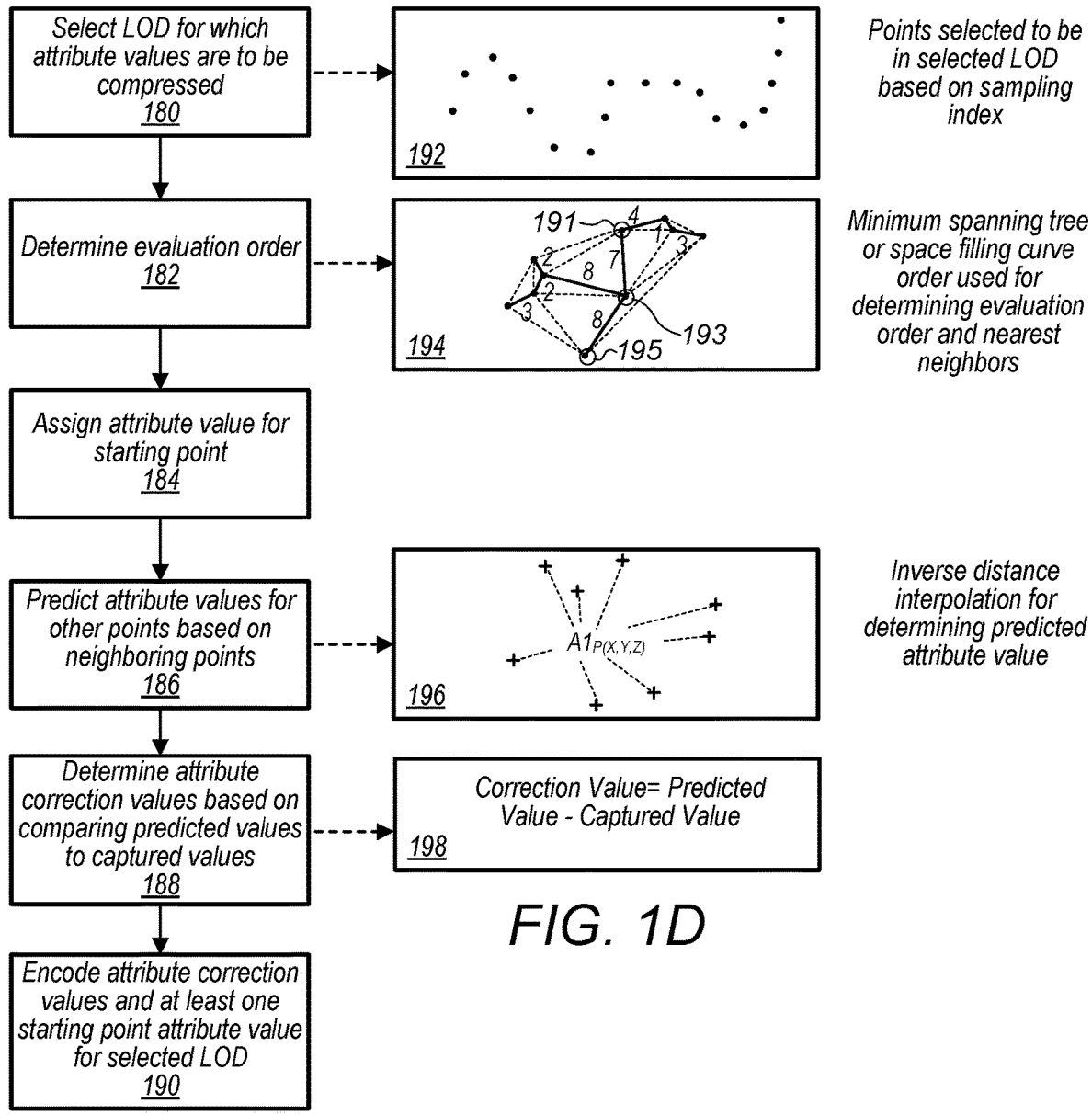
FIGS. 1C-D illustrate a process for compressing and encoding attribute information for points of a point cloud selected to be included in respective levels of detail (LODs) for the point cloud, according to some embodiments.

FIGS. 1C-D illustrate a process for compressing and encoding attribute information for points of a point cloud selected to be included in respective levels of detail (LODs) for the point cloud, according to some embodiments.

At 180, an encoder, such as encoder 104, selects a determined level of detail for which attribute information is to be compressed. For example, 192 illustrates an example set of points of point cloud 162 that have been selected to be included in a first level of detail for point cloud 162. Each point in the point cloud shown in 192 may have one or more attributes associated with the point. Note that point cloud 192 is shown in 2D for ease of illustration, but may include points in 3D space.

At 182, an evaluation order to the points of the point cloud is determined. The evaluation order may be determined based on respective index positions of the points in the index 166 or the sampled index 168. For example the evaluation order may be according to a Morton order.

Also, in some embodiments, a minimum spanning tree may be determined based on the spatial information of the point cloud received by the encoder. In order to determine a minimum spanning tree, a minimum spanning tree generator of an encoder may select a starting point for the minimum spanning tree. The minimum spanning tree generator may then identify points that are adjacent to the starting point. The adjacent points may then be sorted based on respective distances between the respective identified adjacent points and the starting point. The adjacent point that is at the shortest distance from the starting point, may be selected as the next point to be visited. A "weight" of an "edge", e.g. a distance between points in a point cloud, may be determined for an edge between the starting point and the adjacent point selected to be next visited, wherein, longer distances are given greater weights than shorter distances. After the adjacent point closest to the starting point is added to the minimum spanning tree, the adjacent point may then be evaluated and points adjacent to the point currently being evaluated (e.g. the point that was previously selected to be next visited) may be identified. The identified adjacent points may be sorted based on respective distances between the point currently being evaluated and the identified adjacent points. The adjacent point at the shortest distance, e.g. "edge", from the point currently being evaluated may be selected as the next point to be included in the minimum spanning tree. A weight for the edge between the point currently being evaluated and the next selected adjacent point may be determined and added to the minimum spanning tree. A similar process may be repeated for each of the other points of the point cloud to generate a minimum spanning tree for the point cloud.

For example, 194 illustrates an illustration of a minimum spanning tree. In the minimum spanning tree shown in 194, each vertex may represent a point in a point cloud, and the edge weights between vertices, for example, 1, 2, 3, 4, 7, 8, etc. may represent distances between points in the point cloud. For example a distance between vertex 191 and vertex 193 may have a weight of 7, whereas a distance between vertices 193 and 195 may have a weight of 8. This may indicate that a distance in a point cloud between a point corresponding to vertex 193 and a point corresponding to vertex 195 is greater than a distance in the point cloud between a point corresponding to vertex 193 and a point corresponding to vertex 191. In some embodiments, weights shown in a minimum spanning tree may be based on vector distances in 3-D space, such as Euclidean distances.

At 184, an attribute value for one or more attributes of a starting point, such as the starting point used to generate the minimum spanning tree or the starting point determined from the space filling curve index, may be assigned to be encoded and included in compressed attribute information for the point cloud. As discussed above, predicted attribute values for points of a point cloud may be determined based on attribute values of neighboring points. However, an initial attribute value for at least one point is provided to a decoder so that the decoder may determine attribute values for other points using at least the initial attribute value and attribute correction values for correcting predicted attribute values that are predicted based on the initial attribute value. Thus, one or more attribute values for at least one starting point are explicitly encoded in a compressed attribute information file. Additionally, spatial information for the starting point may be explicitly encoded such that a space filling curve or a minimum spanning tree generator of a decoder may determine which point of the points of the point cloud is to be used as a starting point. In some embodiments, a starting point may be indicated in other ways other than explicitly encoding the spatial information for the starting point, such as flagging the starting point or other methods of point identification.

Because a decoder will receive an indication of a starting point and will encounter the same or similar spatial information for the points of the point cloud as the encoder, the decoder may determine a same evaluation order from the same starting point as was determined by the encoder.

At 186, for a current point being evaluated, a prediction/correction evaluator of an encoder determines a predicted attribute value for an attribute of the point currently being evaluated. In some embodiments, a point currently being evaluated may have more than one attribute. Accordingly, a prediction/correction evaluator of an encoder may predict more than one attribute value for the point. For each point being evaluated, the prediction/correction evaluator may identify a set of nearest neighboring points that have assigned or predicted attribute values. In some embodiments, a number of neighboring points to identify, "K", may be a configurable parameter of an encoder and the encoder may include configuration information in a compressed attribute information file indicating the parameter "K" such that a decoder may identify a same number of neighboring points when performing attribute prediction. The prediction/correction evaluator may then use weights from the minimum spanning tree or may otherwise determine distances between the point being evaluated and respective ones of the identified neighboring points. The prediction/correction evaluator may use an inverse distance interpolation method to predict an attribute value for each attribute of the point being evaluated. The prediction/correction evaluator may then predict an attribute value of the point being evaluated based on an average of inverse-distance weighted attribute values of the identified neighboring points.

For example, 196 illustrates a point (X,Y,Z) being evaluated wherein attribute A1 is being determined based on inverse distance weighted attribute values of eight identified neighboring points.

At 188, an attribute correction value is determined for each point. The attribute correction value is determined based on comparing a predicted attribute value for each attribute of a point to corresponding attribute values of the point in an original non-compressed point cloud, such as the points included in the selected LOD. For example, 198 illustrates an equation for determining attribute correction values, wherein a captured value is subtracted from a predicted value to determine an attribute correction value. Note that while, FIG. 1C shows attribute values being predicted at 186 and attribute correction values being determined at 188, in some embodiments attribute correction values may be determined for a point subsequent to predicting an attribute value for the point. A next point may then be evaluated, wherein a predicted attribute value is determined for the point and an attribute correction value is determined for the point. Thus 186 and 188 may be repeated for each point being evaluated. In other embodiments, predicted values may be determined for multiple points and then attribute correction values may be determined. In some embodiments, predictions for subsequent points being evaluated may be based on predicted attribute values or may be based on corrected attribute values or both. In some embodiments, both an encoder and a decoder may follow the same rules as to whether predicted values for subsequent points are to be determined based on predicted or corrected attribute values.

Also note, that for higher levels of detail, e.g. levels of detail greater than the first level of detail, attribute values determined for points in lower levels of detail may be used to predict attribute values of the points in the higher levels of detail. For example, when predicting attribute values for points included in level of detail two (which includes the points of level of detail one plus points of an additional refinement level), the points in level of detail one for which attribute values have already been determined may be selected as neighboring points of the points in refinement level two for which attribute values are being predicted.

At 190, the determined attribute correction values for the points of the selected level of detail (or refinement level) are encoded. Additionally, in some embodiments, one or more assigned attribute values for a starting point, spatial information or other indicia of the starting point, and any configuration information to be included in a compressed attribute information file may be encoded. In some embodiments, various encoding methods, such as arithmetic encoding and/or Golomb encoding may be used to encode the attribute correction values, assigned attribute values, and the configuration information.

Varying Sampling Rates

In order to determine various refinement levels, sampling rates for the ordered index of the points may be defined. For example, to divide a point cloud into four levels of detail, an index that maps a Morton value to a corresponding point may be sampled, for example at a rate of four, where every fourth indexed point is included in the lowest level refinement. For each additional level of refinement remaining points in the index that have not yet been sampled may be sampled, for example every third index point, etc. until all of the points are sampled for a highest level of detail. For example, a low-complexity LOD generation process that utilizes a space filling curve to order points and determine refinement levels, may proceed as follows:

First, the points of the point cloud (for which spatial information is already known) may be ordered according to a space filling curve. For example, the points may be ordered according to their Morton codes, as an example.

Then, Let $I_{L-1}$ be the set of ordered indexes and $LOD_{L-1}$ the associated LOD that represents the entire point cloud.

Next, define a set of sampling rates denoted $(k_l)_{l=0 \ldots L-1}$, where $k_l$ is an integer describing the sampling rate for the LOD l.

$k_l$ can be automatically determined based on the characteristics of the signal and/or the point cloud distribution, previous statistics, or could be fixed.

$k_l$ can be provided as user-defined parameter (e.g., 4).

The sampling rate_$k_l$ could be further updated within an LOD in order to better adapt to the point cloud distribution. More precisely, the encoder may explicitly encode in the bit stream for a predefined group of points (e.g., each consecutive H=1024 points) different values or updates to be applied to the latest available $k_1$ value.

Next, the ordered array of indexes associated with LOD l=L-2, L-3, . . . , 0, denoted as $l_l$, is computed by subsampling $I_{l+1}$, while keeping one index out of every $k_l$ indexes.

In some embodiments, different subsampling rates may be defined per attribute (e.g., color, reflectance) and per channel (e.g., Y and U/V), etc.

Figure 2A:
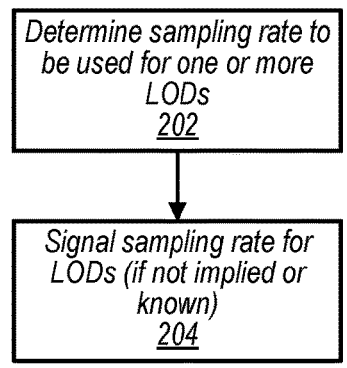
FIG. 2A illustrates a process of determining and signaling a sampling rate to be used to determine points of a point cloud to be included in levels of detail (LODs) for the point cloud, according to some embodiments.

FIG. 2A illustrates a process of determining and signaling a sampling rate to be used to determine points to be included in levels of detail (LODs) of a point cloud, according to some embodiments.

At 202 an encoder may determine one or more sampling rates to be used to determine points to be included in respective refinement levels/levels of detail. In some embodiments, a rate distortion optimization procedure may be used to determine sampling rates to be used for respective refinement levels/levels of detail. In some embodiments, an encoder may utilize known sampling rates that are known by an encoder, or may at 204 signal one or more selected sampling rates in a compressed bit stream. In some embodiments, an encoder may utilize known or implied sampling rates that are known or that can be inferred by a decoder, and may only signal sampling rates for particular LODs that deviate from the known or implied sampling rates.

Figure 2B:
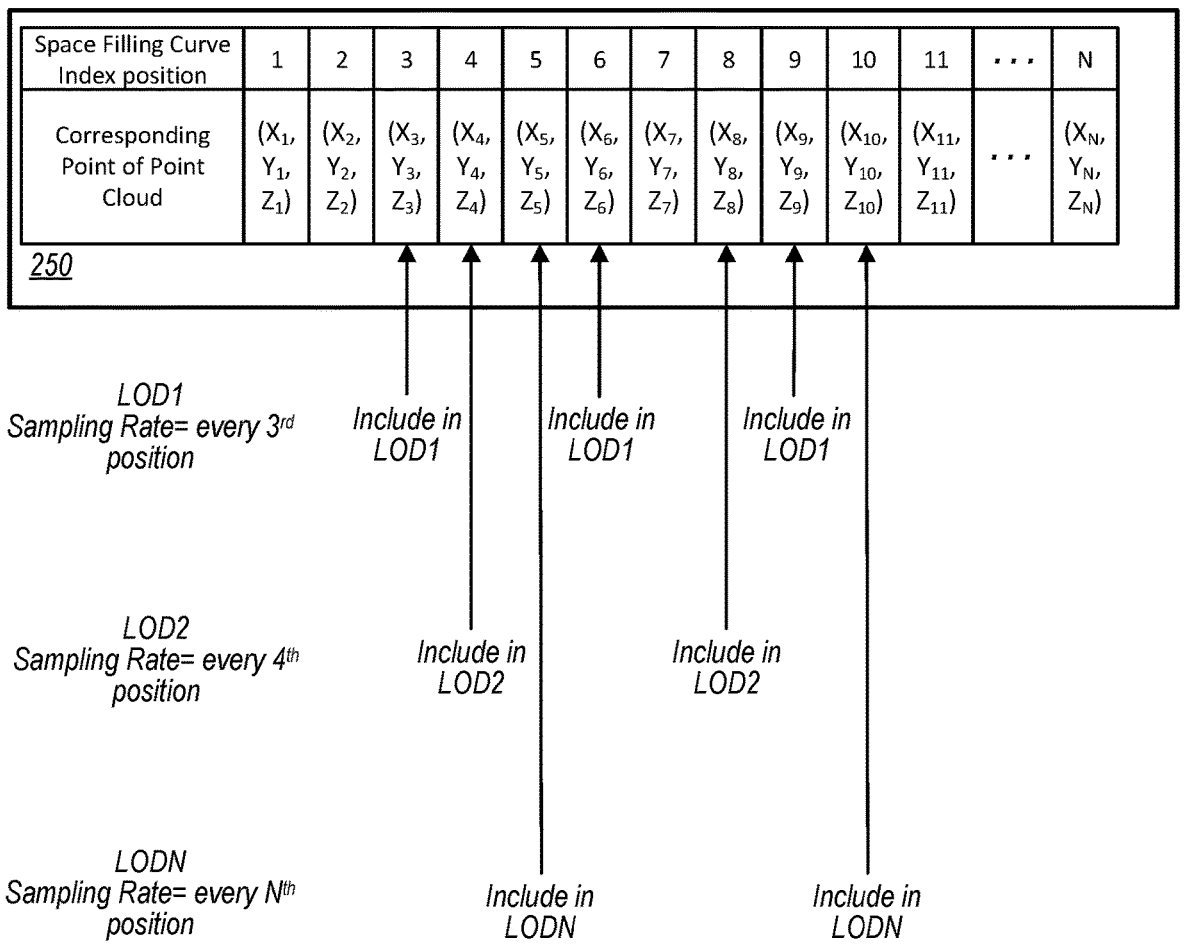
FIG. 2B illustrates an example index generated by applying a space filling curve to a point cloud and also illustrates sampling the index to determine points of the point cloud to be included in respective levels of detail (LODs) for the point cloud, according to some embodiments.

FIG. 2B illustrates an example index generated by applying a space filling curve to a point cloud and also illustrates sampling the index to determine points of the point cloud to be included in respective levels of detail (LODs) of the point cloud, according to some embodiments.

For example, in FIG. 2B index 250 is sampled at a rate of every $3^{rd}$ position to determine points to be included in a first refinement level that correspond to a first level of detail. Also, index 250 is sampled at a rate of every $4^{th}$ position determine points to be included in a second refinement level that when combined with the points included in the first refinement level constitutes a second level of detail. Additionally, index 250 is sampled at a rate every $N^{th}$ position to determine points to be included in an $N^{th}$ refinement level that when combined with points included in preceding refinement levels constitutes an $N^{th}$ level of detail.

Note that in some embodiments, an index being sampled according to a sampling rate for a given level of detail may be the original index determined based on the space filling curve, or may be an index that includes points not yet included in a refinement level and excludes points already included in a refinement level. For example, in some embodiments, every $N^{th}$ position of the positions corresponding to points not yet included in level of detail 1 or level of detail 2 may be sampled to determine the points to include in level of detail N. Conversely, in some embodiments, all of the points/positions of index 250 may be retained when sampling the index and the sampling rate/sampling offset values may be selected such that points included in lower levels of detail are not repeated in later refinement levels.

In some embodiments, prediction between levels of detail may also be used to determine predicted attribute values for the points of the various levels of detail. As discussed earlier, attribute correction values may be encoded for points, wherein the attribute correction values represent a difference between a predicted value and an original or pre-compression value for the attribute.

Adaptive Scanning Mode

In some embodiments, instead of using a single prediction order, as described above, a prediction mode in a low-complexity complexity LOD generation process using a space filling curve may allow for improved coding efficiency by selecting a prediction direction for a given refinement level that gives an improved rate-distortion performance. For example, in one case first level of detail may use the Morton order and in another case may use the inverse Morton order. In another case the traversal of the points may start from the center or any point explicitly signaled by the encoder. The scanning order could also be explicitly encoded in the bit stream or agreed between encoder and decoder. For example, the encoder may explicitly signal to the decoder that a point should be skipped and processed at a later time. Signaling of this mode and its associate parameters could be done at the sequence/frame/tile/slice/LOD/group of points level. In some embodiments, different sampling orders may be selected for different levels of detail.

Figure 3A:
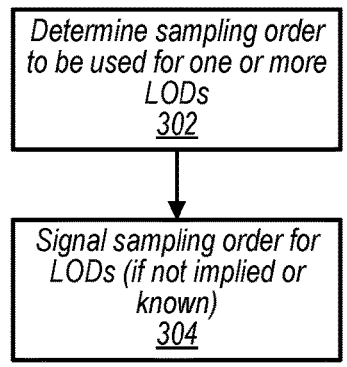
FIG. 3A illustrates a process of determining and signaling a sampling order to be used to determine points of a point cloud to be included in levels of detail (LODs) for the point cloud, according to some embodiments.

FIG. 3A illustrates a process of determining and signaling a sampling order to be used to determine points to be included in levels of detail (LODs) of a point cloud, according to some embodiments.

At 302, an encoder determines one or more sampling orders to be used to determine points to be included in one or more levels of detail/refinement levels. In some embodiments, a rate distortion optimization procedure may be used to determine sampling orders to be used for respective refinement levels/levels of detail. In some embodiments, an encoder may utilize known sampling orders that are known by an encoder, or may at 304 signal one or more selected sampling orders in a compressed bit stream. In some embodiments, an encoder may utilize known or implied sampling orders that are known or that can be inferred by a decoder, and may only signal sampling orders for particular LODs that deviate from the known or implied sampling orders.

Figure 3B:
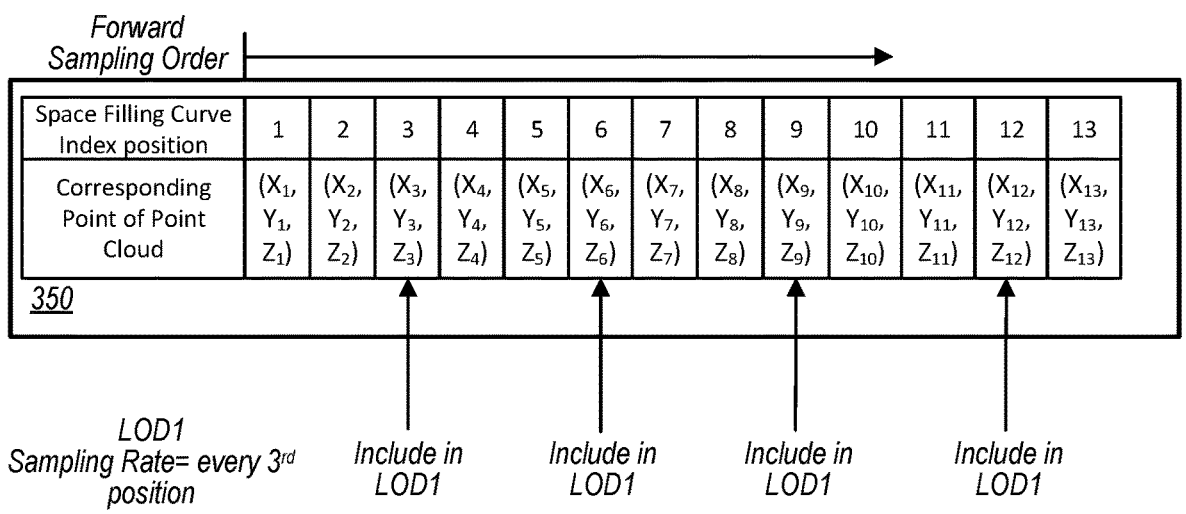
FIG. 3B illustrates an example index generated by applying a space filling curve to a point cloud and also illustrates sampling the index in a forward sampling order to determine points of the point cloud to be included in respective levels of detail (LODs) for the point cloud, according to some embodiments.

FIG. 3B illustrates an example index generated by applying a space filling curve to a point cloud and also illustrates sampling the index in a forward sampling order to determine points of the point cloud to be included in respective levels of detail (LODs) of the point cloud, according to some embodiments.

For example, FIG. 3B illustrates index 350 being sampled in a forward sampling order at a sampling rate of every $3^{rd}$ position.

Figure 3C:
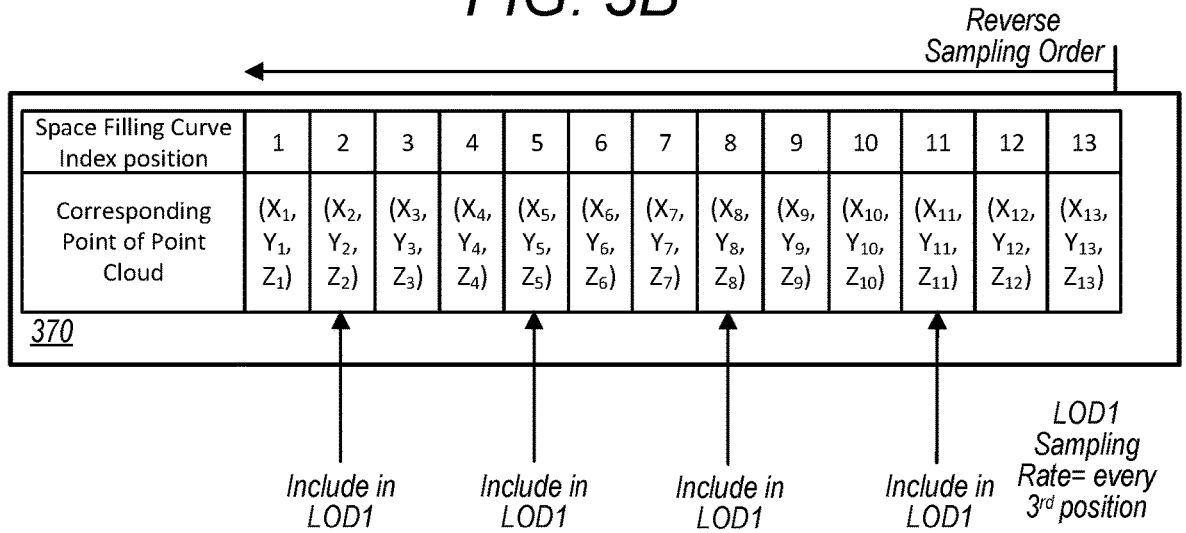
FIG. 3C illustrates an example index generated by applying a space filling curve to a point cloud and also illustrates sampling the index in a reverse sampling order to determine points of the point cloud to be included in respective levels of detail (LODs) for the point cloud, according to some embodiments.

FIG. 3C illustrates an example index generated by applying a space filling curve to a point cloud and also illustrates sampling the index in a reverse sampling order to determine points of the point cloud to be included in respective levels of detail (LODs) of the point cloud, according to some embodiments.

For example, FIG. 3C illustrates index 370 being sampled in a reverse sampling order at a sampling rate of every $3^{rd}$ position. Note that the reverse sampling order starts sampling index positions from an opposite end of the index than is the case for the forward sampling order illustrated in FIG. 3B. Also note, that in some embodiments, sampling the same index at the same sampling rate according to a different sampling order may result in different points being selected to be included in a given refinement level/level of detail. For example, the points determined to be included in the first level of detail based on sampling index 370 in the reverse sampling order are different than the points selected when sampling index 350 in the forward sampling order.

Figure 3D:
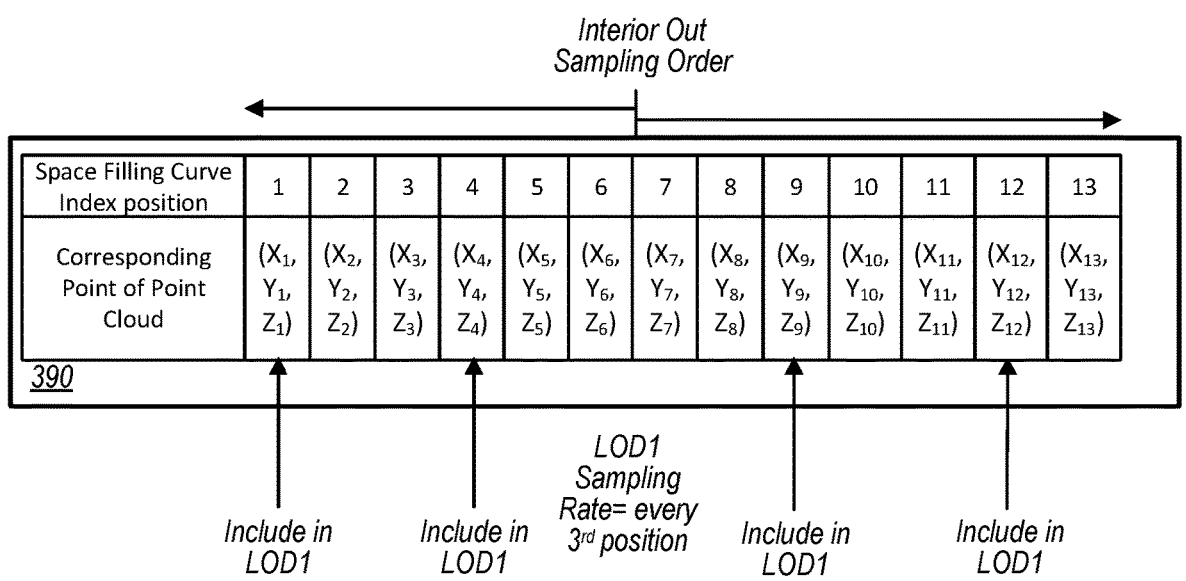
FIG. 3D illustrates an example index generated by applying a space filling curve to a point cloud and also illustrates sampling the index in an interior out sampling order to determine points of the point cloud to be included in respective levels of detail (LODs) for the point cloud, according to some embodiments.

FIG. 3D illustrates an example index generated by applying a space filling curve to a point cloud and also illustrates sampling the index in an interior out sampling order to determine points of the point cloud to be included in respective levels of detail (LODs) of the point cloud, according to some embodiments.

For example, FIG. 3D illustrates index 390 being sampled in an interior out sampling order at a sampling rate of every $3^{rd}$ position. Note that the interior out sampling order starts sampling index positions from an interior position of the index and proceeds to sample the index at every $3^{rd}$ position in either direction from the interior position. This too results in a different set of points being selected to be included in the first level of detail that is different than the points selected according to the forward sampling order and the reverse sampling order. In some embodiments, an interior position starting point may be a center position in the index or may be offset from the center.

In some embodiments, an adaptive scanning mode may be used where higher LODs permit prediction of their samples from current lower LOD samples. This may of course impact the decoding process of the higher level LOD (e.g. limit its parallelization capability). Parallelization, however, could still be achieved by defining "independent" decoding groups within an LOD. Such groups may allow parallel decoding by not permitting prediction across them. However, prediction using the lower level LOD as well as decoded samples within the current LOD group may be permitted.

In some embodiments, an encoder may select the appropriate adaptive scanning mode by utilizing rate distortion optimization (RDO) strategies. In some embodiments, an encoder may further take into account various additional criteria, such as computational complexity, battery life, memory requirement, latency, pre-analysis, collected statistics of past frames (history), user feedback, etc.

Adaptive Scanning Offset Mode

In some embodiments, another mode that may be applied in a low-complexity complexity LOD generation process using a space filling curve may be an "alternate sampling phase/offset" mode. For example, an encoder may signal to the decoder a sampling offset value that is used for selecting which points should be sampled from the index when generating the next LOD level. For example a sampling offset value of 1 may provide better rate distortion (RD) performance than offset value of 0. For example, instead of beginning the sampling of the ordered Morton codes with the first Morton code for the first point, the sampling may begin at an offset value, e.g. the second, third, etc. Morton code. This could have an impact in performance since this could alter the coding and prediction process for each LOD. Signaling of the sampling offset could be done at the sequence/frame/tile/slice/LOD/group of points level.

Figure 4A:
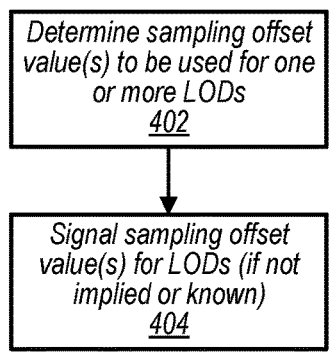
FIG. 4A illustrates a process of determining and signaling a sampling offset value to be used to determine points of a point cloud to be included in levels of detail (LODs) for the point cloud, according to some embodiments.

FIG. 4A illustrates a process of determining and signaling a sampling offset value to be used to determine points to be included in levels of detail (LODs) of a point cloud, according to some embodiments.

At 402, an encoder determines one or more sampling offset values to be used to determine points to be included in one or more levels of detail/refinement levels. In some embodiments, a rate distortion optimization procedure may be used to determine sampling offset values to be used for respective refinement levels/levels of detail. In some embodiments, an encoder may utilize known sampling offset values that are known by an encoder, or may at 304 signal one or more selected sampling offset values in a compressed bit stream. In some embodiments, an encoder may utilize known or implied sampling offset values that are known or that can be inferred by a decoder, and may only signal sampling offset values for particular LODs that deviate from the known or implied sampling offset values. In some embodiments, in the absence of a sampling offset value being implied or signaled no offset may be applied.

Figure 4B:
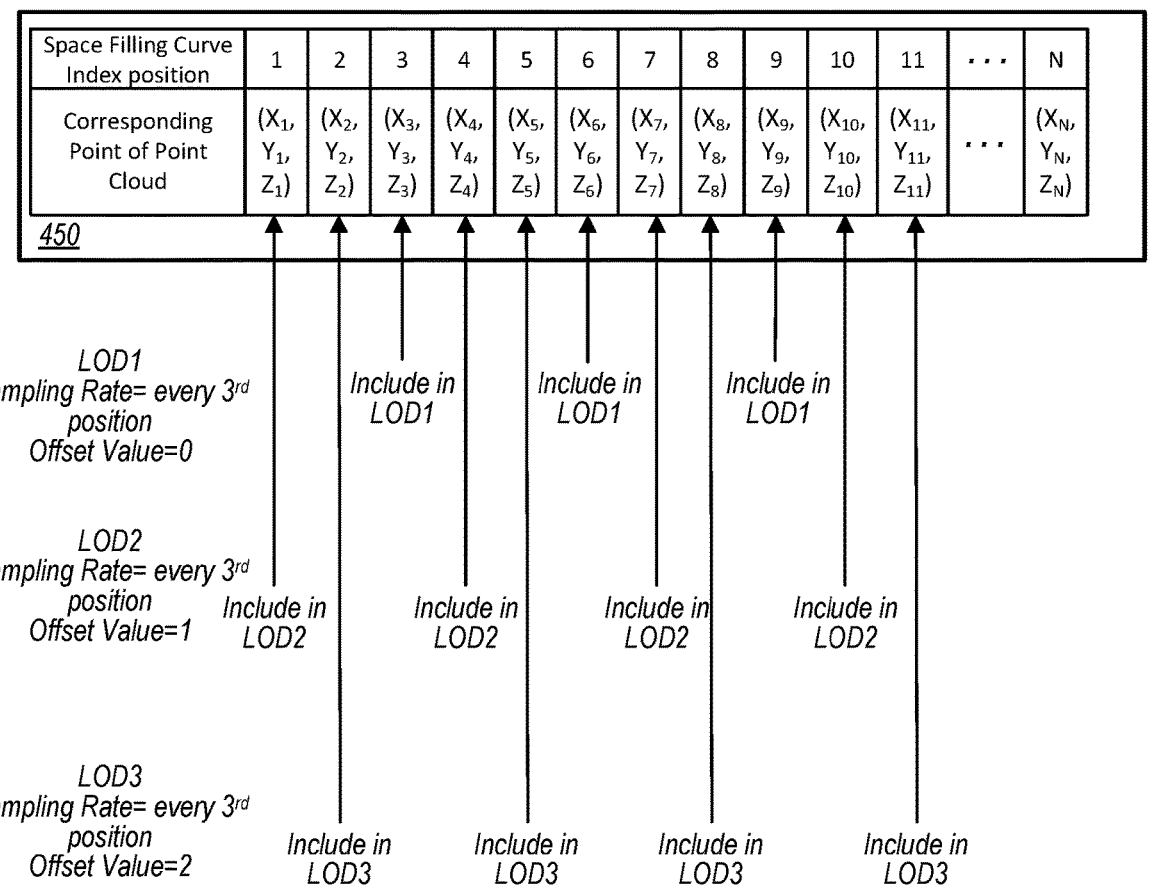
FIG. 4B illustrates an example index generated by applying a space filling curve to a point cloud and also illustrates sampling the index using different sampling offset values to determine points of the point cloud to be included in respective levels of detail (LODs) for the point cloud, according to some embodiments.

FIG. 4B illustrates an example index generated by applying a space filling curve to a point cloud and also illustrates sampling the index using different sampling offset values to determine points of the point cloud to be included in respective levels of detail (LODs) of the point cloud, according to some embodiments.

For example, FIG. 4B illustrates index 450 being sampled using sampling rate of every third position and a sampling offset value of zero to determine points to be included in a first level of detail. To determine points to be included in second refinement level/level of detail, the same sampling rate of every third position is used, but a sampling offset value of one is applied. To determine points to be included in a third refinement level/level of detail, the same sampling rate of every third position is used, but a sampling offset value of two is applied. As can be seen, even when applying the same sampling rate, a sampling offset value can be used to shift which points at particular index positions of the index are selected to be included in a given level of detail.

In some embodiments, various combinations of sampling rates, sampling orders, and/or sampling offset values may be selected to be applied to determine points to be included in various levels of detail of a point cloud that is being compressed.

In some embodiments, a rate distortion optimization procedure may be followed to test various combinations of sampling rates, sampling orders, and/or sampling offset values to determine sets of sampling parameters that balance a desire to maximize compression efficiency and a desire to minimize distortion.

Figure 5:
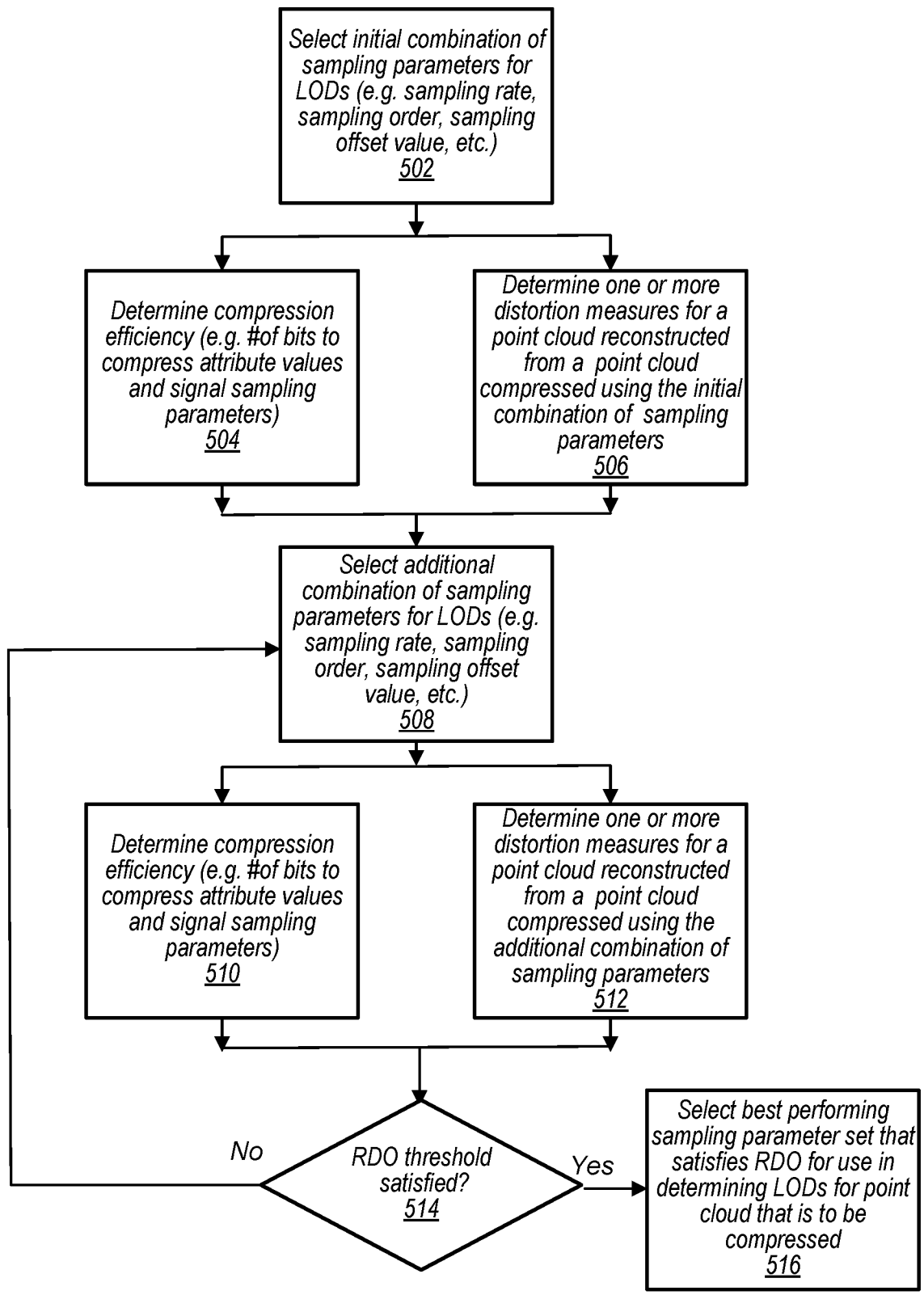
FIG. 5 illustrates a process for determining sampling parameters to be used to determine points of a point cloud to be included in respective levels of detail (LODs) for the point cloud, according to some embodiments.

FIG. 5 illustrates a process for determining sampling parameters to be used to determine points to be included in respective levels of detail (LODs) of a point cloud, according to some embodiments.

At 502, a rate distortion optimization module of an encoder selects an initial combination of sampling parameters to be applied to select points to be included in respective levels of detail for a point cloud being compressed. For example, various combinations of sampling rates, sampling orders, sampling offset values, etc. may be selected for determining the points to be included in the respective levels of detail for the point cloud being compressed.

At 504, the rate distortion optimization module may determine a compression efficiency of the selected combination of sampling parameters. For example, the rate distortion optimization module may determine a number of bits required to compress the attribute values for the respective points when the points are organized into levels of detail as determined according to the initial combination of sampling parameters. Also, the rate distortion optimization module may determine a number of bits required to signal the sampling parameters. For example, some sampling parameters may be known to a decoder such that only exceptions need to be signaled, thus selecting sampling parameters that need to be signaled as opposed to default or known sampling parameters may require more bits.

At 506, the rate distortion optimization module determines one or more distortion measures for a reconstructed version of the point cloud, wherein the reconstructed version of the point cloud is reconstructed using compressed attribute information determined for points organized into levels of detail based on the initial combination of sampling parameters (e.g. the same sampling parameters applied at 504).

At 508, the rate distortion optimization module selects an additional combination of sampling parameters to be applied to select points to be included in respective levels of detail for the point cloud being compressed. For example, various combinations of sampling rates, sampling orders, sampling offset values, etc. may be selected for determining the points to be included in the respective levels of detail for the point cloud being compressed. The combination of sampling parameters selected at 508 includes at least one or more different sampling parameter values than the initial combination of sampling parameters selected at 502.

At 510 the rate distortion optimization module determines a compression efficiency when the combination of sampling parameters selected at 508 are applied. Also, at 512, the rate distortion optimization module determines one or more distortion measures when the combination of sampling parameters selected at 508 are applied.

While, FIG. 5 shows a rate distortion optimization testing at least two combinations of sampling parameters to perform an optimization, in some embodiments any number of combinations of sampling parameters may be tested.

In some embodiments, a minimum rate distortion optimization threshold, such as a minimum compression efficiency or maximum acceptable level of distortion may also be imposed. For example, at 514, it may be determined if an RDO threshold is satisfied. If not the process may revert to 508 and a next combination of sampling parameters may be tested. However, if the RDO threshold is satisfied at 514, then at 516 a best performing combination of sampling parameters (e.g. lowest distortion/greatest compression efficiency) of the tested combinations may be selected for use in determining points to be included in respective LODs for compressing attribute information of a point cloud being compressed.

Attribute Interleaving Mode

In some embodiments, attributes/attribute channels of the point cloud could be interleaved at different levels when predicting and coding/decoding the residual data (e.g. attribute correction values) for each LOD level. In particular, interleaving could be done at:

Point level,
Group of points level,
LOD level,
Slice level, and/or
Frame level.

In some embodiments, interleaving may be done at the attribute channel level. For example, color channels may be interleaved together, while other attributes are only interleaved at the LOD level. However, in some embodiments, different combinations could be used for different types of attribute data. The interleaving method could be fixed and known between encoder and decoder, but could also be adaptive and could be signaled at different levels of the bit stream. The decision for the method used could be based on rate distortion (RD) criteria, pre-analysis, past encoding statistics, encoding/decoding complexity, or some other criteria that a user or system has determined.

Figure 6:
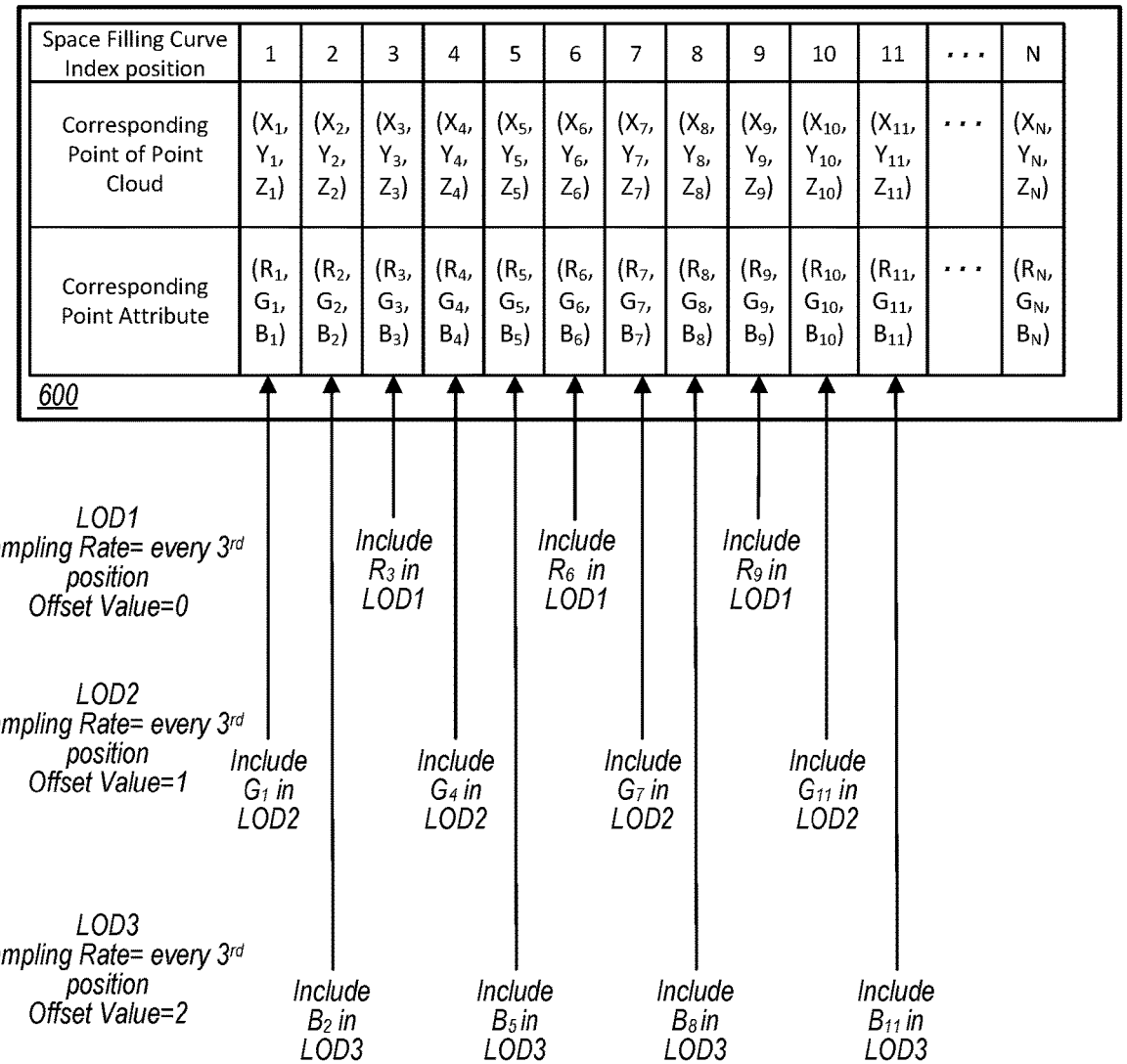
FIG. 6 illustrates an example of interleaving attribute correction values between different levels of detail (LODs) for a point cloud, according to some embodiments.

FIG. 6 illustrates an example of interleaving attribute correction values between different levels of detail (LODs) of a point cloud, according to some embodiments.

Index 600 is shown being sampled at a rate of every $3^{rd}$ position with sampling offset values of 0, 1, and 2 to generate a first, second, and third level of detail respectively. However, instead of encoding red, green, blue channel values for each point included in the respective levels of detail, red channel values are encoded for the first level of detail, while green channel values are encoded for the second level of detail, and blue channel values are encoded for the third level of detail. In some embodiments, a decoder may predict attribute correction values not included in a given level of detail based on attribute correction values interleaved for other levels of detail. For example, for the points included in level of detail two, a decoder may directly decode the green channel attribute correction values and may predict the red attribute correction values based on the red channel attribute correction values ended for adjacent points in the level of detail one. Also based on the known green channel attribute correction values and the predicted red channel attribute correction values, the encoder may imply blue attribute channel correction values to be applied to the points included in the second level of detail.

Inter Attribute/Cross-Component Prediction

In some embodiments, different interleaving methods may permit also inter-attribute/attribute channel prediction, which may result in more coding benefits. For instance, for YCbCr data, the Cb and Cr color components could be predicted through their luma component. Such a prediction mode could be selected at various levels, such as:

Point level,
Group of points level,
LOD level,
Slice level, and/or
Frame level.

In some embodiments, different prediction methods may be used. For example, the prediction could use a linear or non-linear prediction model, where the parameters of the model (e.g., scale and offset in a model of Chroma=a*Y+b) are also signaled to the decoder. Such parameters could be estimated in the encoder using different methods, e.g. using a least squares method. An alternative mode would be to combine the Luma-based prediction with the value generated through the conventional prediction method. For instance, we the weighted average of the Luma-based and the distance-based predictors could be considered. The weighting parameters could be explicitly encoded in the bit stream or could be implicitly determined by the decoder. An encoder could determine such parameters using, for example, rate distortion (RD) based criteria, or other methods that may take in account pre-analysis and past statistics of the encoding process.

In some embodiments, the prediction strategy for the current point attribute could also be adapted based on already encoded/decoded attribute/attribute channel values for the same point. For instance, if the Luma (or other X attribute) value is known for a given point, neighbors could be excluded from the prediction process for the given point, where the neighbors have Luma (or X attribute) values that vary greatly from the Luma (or X attribute) values for the given point. For example, based on the variance between Luma (or X attribute) values, chroma components or other attributes of the neighboring points may be excluded from prediction for the given point. In some embodiments, prediction may be done only with points that have similar characteristics, e.g. satisfy multiple attribute thresholds and not only distance ones. The encoder may explicitly signal which already encoded/decoded attributes or attribute channels should be used for the prediction adaptation. Similarity could be determined based on a threshold T or a set of thresholds, assuming multiple attributes are considered for the prediction selection process, T could be signaled in the bit stream. Such threshold/threshold sets could be signaled at different levels of the coding process, e.g. groups of points, LOD, slices, tiles, frames, or sequence.

Combined Ordering/Sampling LOD Method

In some embodiments, a low-complexity LOD generation process that utilizes a space filling curve to order points and determine refinement levels may be combined with a distance-based refinement procedure as described above. For example, for portions of a point cloud with smooth attribute signals that are regularly sampled, a distance-based refinement strategy may be used. However, for portions of the point cloud that include non-smooth attribute signals that are irregularly sampled, a low-complexity LOD generation process that utilizes a space filling curve to order points and determine refinement levels may be used. In some embodiments, switching between the distance-based LOD generation process and the low-complexity LOD generation process using a space filling curve may be operated at:

Group of points level,
LOD level,
Slice level, and/or
Frame level.

Figure 7:
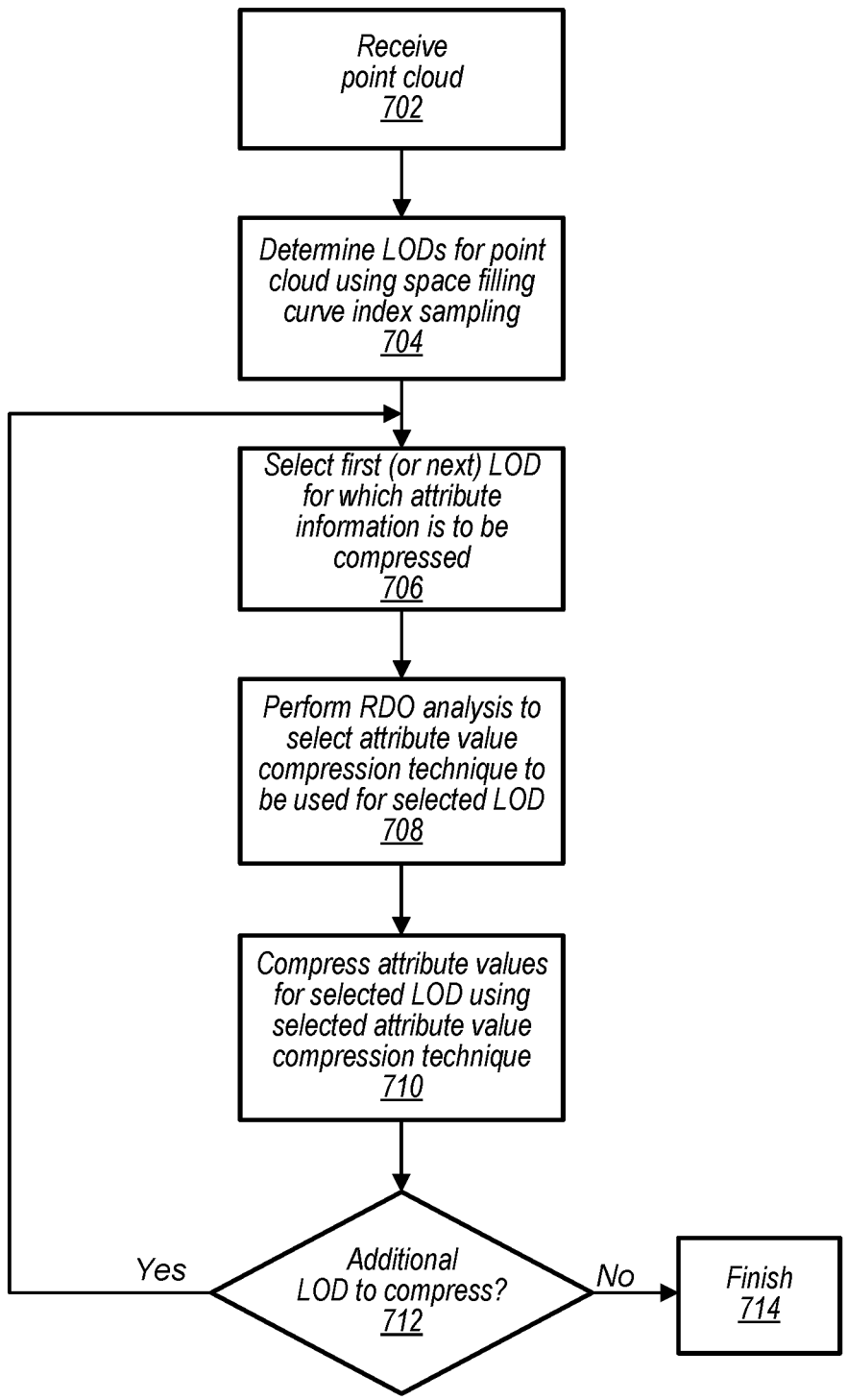
FIG. 7 illustrates an example process for determining points of a point cloud to be included in levels of detail (LODs) for the point cloud and compressing attribute information for the points determined to be included in the LODs, according to some embodiments.

In FIG. 7 illustrates an example process for determining points of a point cloud to be included in levels of detail (LODs) for the point cloud and compressing attribute information for the points determined to be included in the LODs, according to some embodiments.

At 702, an encoder receives a point cloud to be compressed. At 704, the encoder utilizes a space filing curve index sampling process as described above to determine points of the point cloud to be included in various levels of detail.

At 704, the encoder selects a first (or next) level of detail/refinement level for which attribute information is to be compressed.

At 708, the encoder performs a rate distortion optimization to determine a compression technique to be used to compress the attribute values. For example, the encoder may determine that a nearest neighbor inverse distance prediction technique is to be used. Alternatively the encoder may determine that a space filling curve neighborhood prediction technique is to be used. For example, in a space filing curve neighborhood technique, points in a given LOD at positions in a space filing curve index on either side of a point being evaluated may be selected as nearest neighbors without requiring Euclidean distances to be calculated. Such a technique may weight attribute values of neighboring points based on respective distances of the neighboring points in the index. Whereas a nearest neighbor inverse distance prediction technique may require Euclidean distances to be calculated and may utilize the Euclidean distances to weight attribute values of neighboring points when predicting an attribute value of a given point being evaluated.

At 710, the encoder then compresses the attribute values for the selected level of detail using the selected attribute value compression technique (selected at 708).

At 712, the encoder determines if there are additional levels of detail to compress. If so the process repeats at 706 for the next level of detail. If not, the process finishes at 714.

Figure 8:
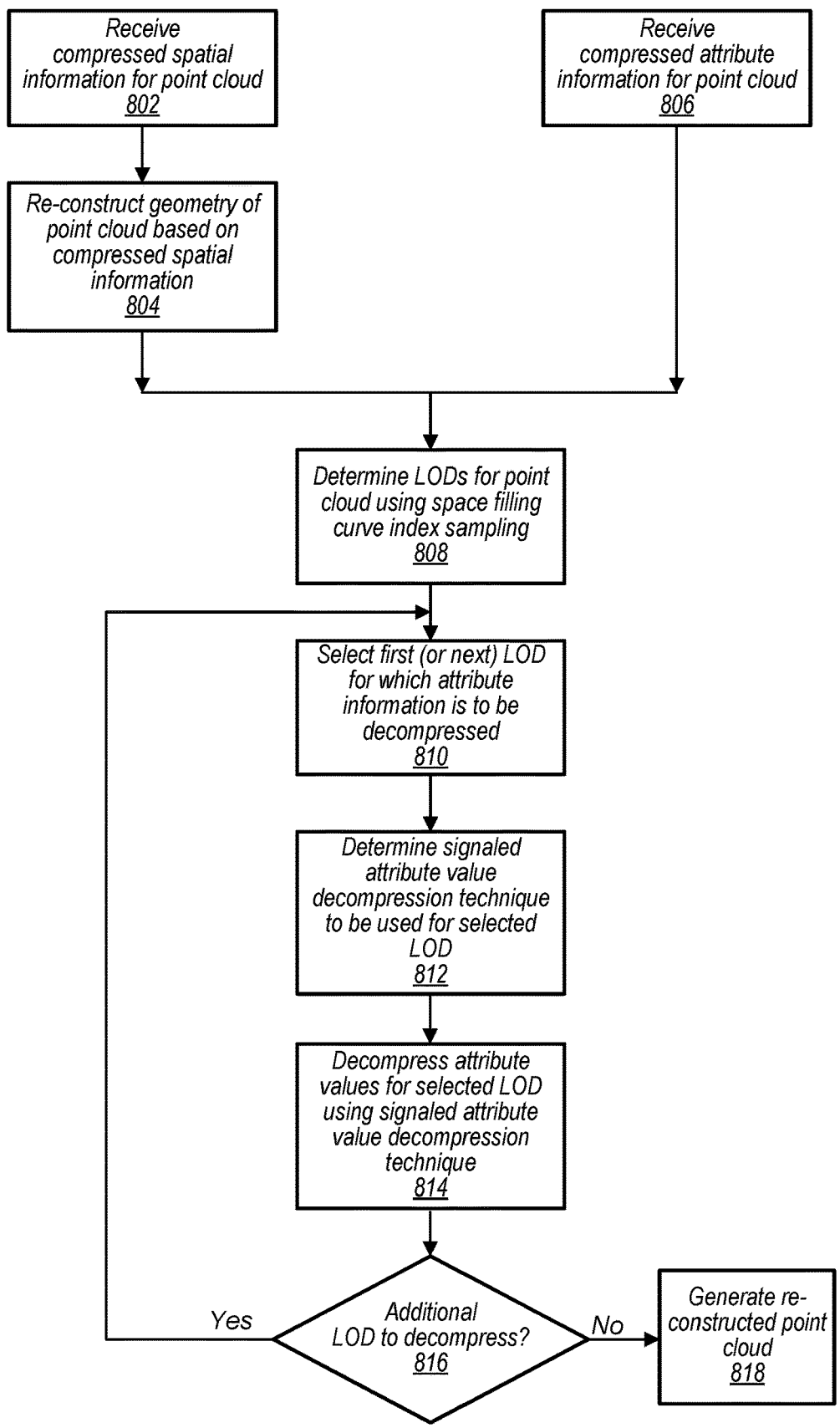
FIG. 8 illustrates an example process for decompressing compressed attribute information for points included in one or more levels of detail (LODs) of a point cloud, according to some embodiments.

FIG. 8 illustrates an example process for decompressing compressed attribute information for points included in one or more levels of detail (LODs) of a point cloud, according to some embodiments.

At 802, a decoder receives compressed spatial information for a point cloud. The spatial information may have been compressed using a K-D tree, Octree, sub-sampling and prediction process, etc. At 804, the decoder reconstructs the geometry of the point cloud based on the compressed spatial information. Also, at 806, the decoder receives compressed attribute information for one or more levels of detail of the compressed point cloud.

At 808, the decoder determines levels of detail for the point cloud using a space filling curve index sampling technique. For example the decoder may apply a same space filling curve as applied by an encoder to the reconstructed geometry of the point cloud. This may result in a same index of positions, such as any of the indexes described in FIG. 1-7. Also, the decoder may apply a same set of sampling parameters to the index to sample the index in a same way as was done at the encoder to generate levels of detail comprising the same points as were determined to be included in the respective levels of detail at the encoder.

At 810, the decoder selects a first (or next) level of detail for which attribute values are to be reconstructed based on the compressed attribute information received at 806.

At 812, the decoder determines an implied or a signaled attribute prediction technique to be used for the selected level of detail, e.g. a nearest neighbor inverse distance prediction technique, a space filling curve neighborhood prediction technique, etc.

At 814, the decoder decompresses attribute information for the selected level of detail using the selected attribute prediction technique.

At 816, the decoder determines if additional levels of detail are to be decompressed, and if so reverts to 810 and selects a next level of detail to decompress. If not, reconstructed point cloud is generated at 818.

Prediction Adaptation

In some embodiments, the prediction adaptation process could also leverage various statistics related to the point cloud geometry (e.g. spatial information). For instance, it could include only points with the same x and/or y and/or z value and exclude others (not only based on distance but also based on other geometric criteria such as angles. Prediction could also include points that are limited in distance across one or more dimensions. For example, points that are within an overall distance D may be included, while, however also these points are also within a distance along the coordinate axes such as an X-distance (dx), a Y-distance (dy), or a Z-distance (dz) from the current point. Such prediction mode could be selected/signaled at various levels.

Dependent LOD Encoder Optimization

In some embodiments, an encoder could select the encoding parameters for the current LOD by considering not only its own distortion/coding performance but also the distortion introduced while predicting the next LOD. Such distortion could be computed for all attributes or a subset (e.g., the luma component only) of attributes. Such subset could be predetermined by the user or some other means, e.g. by analyzing the data and determining, which attribute is most active/has the most energy. For example, which attribute has the most impact on prediction of other attributes and prediction across multiple refinement levels or LODs. The distortion evaluated for the next LOD could be Mean Square Error (MSE)-based or could consider some other distortion criteria. Subsampling of the points in the next LOD could also be considered to reduce complexity. For example, only half the impacted samples in that LOD could be considered in this computation. Sampling could be random, fixed based on some defined sampling process, or could also be based on the characteristics of the signals, e.g. the LOD could be analyzed and the most "important" points in the LOD could be considered. Importance could be determined for example based on the magnitude of the attribute.

Example Encoder

Figure 9A:
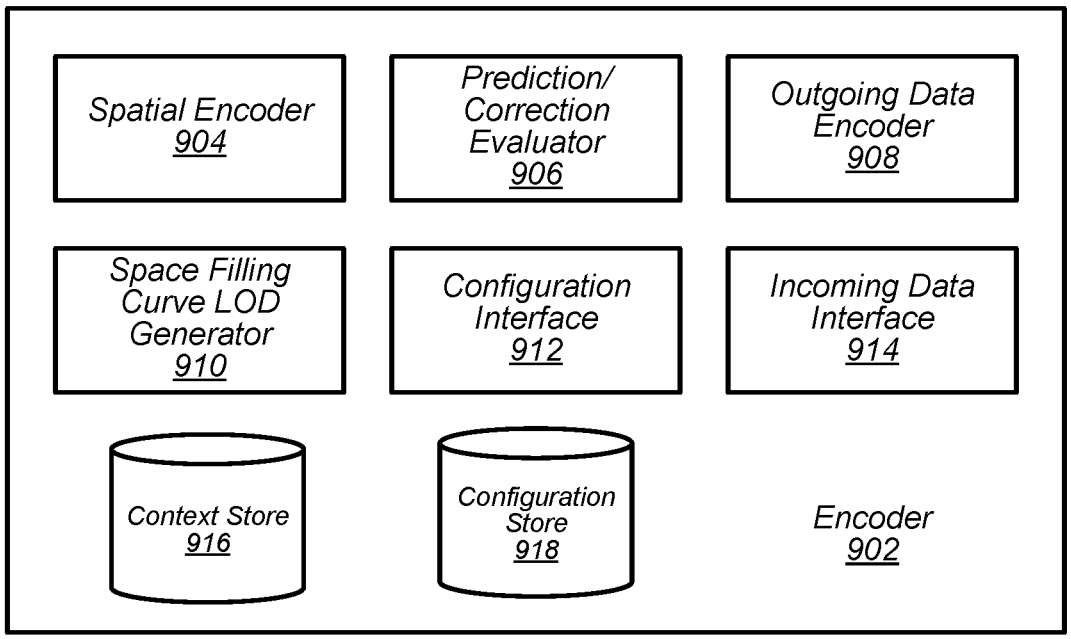
FIG. 9A illustrates example components of an encoder, according to some embodiments.

FIG. 9A illustrates components of an encoder, according to some embodiments. Encoder 902 may be a similar encoder as encoder 104 illustrated in FIG. 1A. Encoder 902 includes spatial encoder 904, space filling curve LOD generator 910, prediction/correction evaluator 906, incoming data interface 914, and outgoing data interface 908. Encoder 902 also includes context store 916 and configuration store 918.

In some embodiments, a spatial encoder, such as spatial encoder 904, may compress spatial information associated with points of a point cloud, such that the spatial information can be stored or transmitted in a compressed format. In some embodiments, a spatial encoder, may utilize K-D trees to compress spatial information for points of a point cloud as discussed in more detail in regard to FIG. 13. Also, in some embodiments, a spatial encoder, such as spatial encoder 904, may utilize a sub-sampling and prediction technique as discussed in more detail in regard to FIGS. 12A-B. In some embodiments, a spatial encoder, such as spatial encoder 904, may utilize Octrees to compress spatial information for points of a point cloud.

In some embodiments, compressed spatial information may be stored or transmitted with compressed attribute information or may be stored or transmitted separately. In either case, a decoder receiving compressed attribute information for points of a point cloud may also receive compressed spatial information for the points of the point cloud, or may otherwise obtain the spatial information for the points of the point cloud.

A space filling curve LOD generator, such as space filling curve LOD generator 910, may utilize spatial information for points of a point cloud to determine points of the point cloud to be included in respective LODs For example a space filling curve LOD generator may utilize any of the processes described in FIGS. 1-8. Because a decoder is provided or otherwise obtains the same spatial information for points of a point cloud as are available at the encoder, LODs determined by a space filling curve LOD generator of an encoder, such as space filling curve LOD generator 910 of encoder 902, may be the same or similar as LODs generated by a space filling curve LOD generator of a decoder, such as space filing curve LOD generator 928 of decoder 920.

A prediction/correction evaluator, such as prediction/correction evaluator 906 of encoder 902, may determine predicted attribute values for points of a point cloud based on an inverse distance interpolation method using attribute values of the K-nearest neighboring points of a point for whom an attribute value is being predicted. The prediction/correction evaluator may also compare a predicted attribute value of a point being evaluated to an original attribute value of the point in a non-compressed point cloud to determine an attribute correction value. Alternatively, the prediction/correction evaluator 906 may utilize other prediction techniques, such as a space filing curve neighborhood prediction technique.

An outgoing data encoder, such as outgoing data encoder 908 of encoder 902, may encode attribute correction values and assigned attribute values included in a compressed attribute information file for a point cloud. In some embodiments, outgoing data encoder 908 may further encode sampling parameters to be used to generate LODs. In some embodiments, an outgoing data encoder, such as outgoing data encoder 908, may select an encoding context for encoding a value, such as an assigned attribute value or an attribute correction value, based on a number of symbols included in the value. In some embodiments, values with more symbols may be encoded using an encoding context comprising Golomb exponential encoding, whereas values with fewer symbols may be encoded using arithmetic encoding. In some embodiments, encoding contexts may include more than one encoding technique. For example, a portion of a value may be encoded using arithmetic encoding while another portion of the value may be encoded using Golomb exponential encoding. In some embodiments, an encoder, such as encoder 902, may include a context store, such as context store 916, that stores encoding contexts used by an outgoing data encoder, such as outgoing data encoder 908, to encode attribute correction values and assigned attribute values.

In some embodiments, an encoder, such as encoder 902, may also include an incoming data interface, such as incoming data interface 914. In some embodiments, an encoder may receive incoming data from one or more sensors that capture points of a point cloud or that capture attribute information to be associated with points of a point cloud. For example, in some embodiments, an encoder may receive data from an LIDAR system, 3-D-camera, 3-D scanner, etc. and may also receive data from other sensors, such as a gyroscope, accelerometer, etc. Additionally, an encoder may receive other data such as a current time from a system clock, etc. In some embodiments, such different types of data may be received by an encoder via an incoming data interface, such as incoming data interface 914 of encoder 902.

In some embodiments, an encoder, such as encoder 902, may further include a configuration interface, such as configuration interface 912, wherein one or more parameters used by the encoder to compress a point cloud may be adjusted via the configuration interface. In some embodiments, a configuration interface, such as configuration interface 912, may be a programmatic interface, such as an API. Configurations used by an encoder, such as encoder 902, may be stored in a configuration store, such as configuration store 918.

In some embodiments, an encoder, such as encoder 902, may include more or fewer components than shown in FIG. 9A.

Figure 9B:
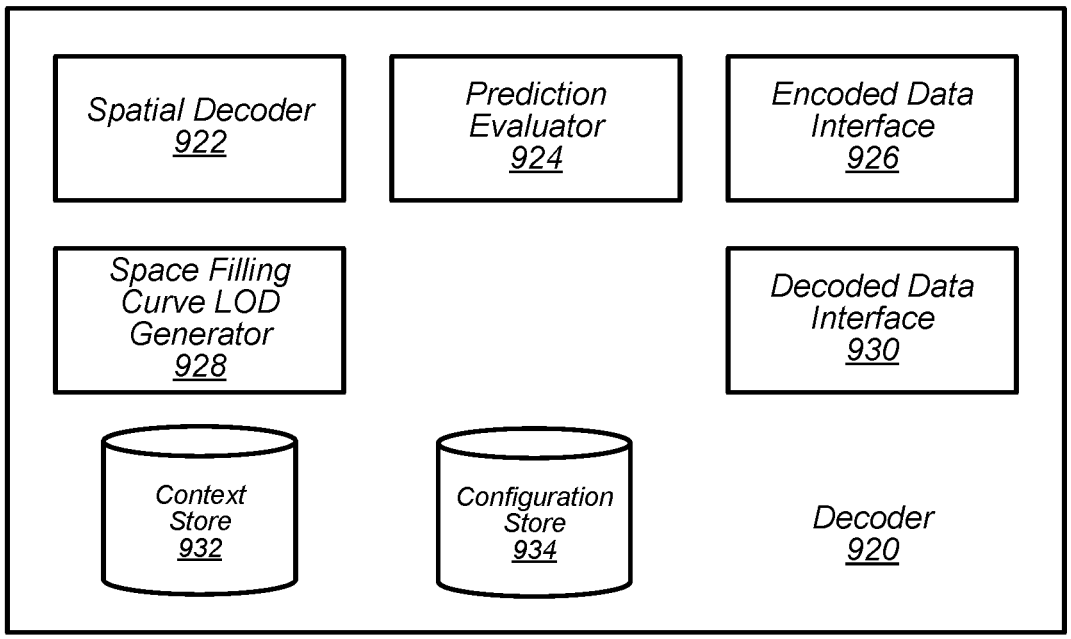
FIG. 9B illustrates example components of a decoder, according to some embodiments.

FIG. 9B illustrates components of a decoder, according to some embodiments. Decoder 920 may be a similar decoder as decoder 116 illustrated in FIG. 1A. Decoder 920 includes encoded data interface 926, spatial decoder 922, space filling curve LOD generator 928, prediction evaluator 924, context store 932, configuration store 934, and decoded data interface 920.

A decoder, such as decoder 920, may receive an encoded compressed point cloud and/or an encoded compressed attribute information file for points of a point cloud. For example, a decoder, such as decoder 920, may receive a compressed attribute information file, such a compressed attribute information 112 illustrated in FIG. 1A or compressed attribute information file 1000 illustrated in FIG. 10. The compressed attribute information file may be received by a decoder via an encoded data interface, such as encoded data interface 926. The encoded compressed point cloud may be used by the decoder to determine spatial information for points of the point cloud. For example, spatial information of points of a point cloud included in a compressed point cloud may be generated by a spatial information generator, such as spatial information generator 922. In some embodiments, a compressed point cloud may be received via an encoded data interface, such as encoded data interface 926, from a storage device or other intermediary source, wherein the compressed point cloud was previously encoded by an encoder, such as encoder 902. In some embodiments, an encoded data interface, such as encoded data interface 926, may decode spatial information. For example the spatial information may have been encoded using various encoding techniques such as arithmetic encoding, Golomb encoding, etc. A spatial information generator, such as spatial information generator 922, may receive decoded spatial information from an encoded data interface, such as encoded data interface 926, and may use the decoded spatial information to generate a geometric representation of the geometry of the point cloud being decompressed. For example, decoded spatial information may be formatted as residual values to be used in a sub-sampled prediction method to recreate a geometry of a point cloud to be decompressed. In such situations, the spatial information generator 922, may recreate the geometry of the point cloud being decompressed using decoded spatial information from encoded data interface 926, and space filling curve LOD generator 928 may determine LODs for the point cloud being decompressed based on the recreated geometry for the point cloud being decompressed generated by spatial information generator 922.

A prediction evaluator of a decoder, such as prediction evaluator 924, may select a starting point of a LOD based on an assigned starting point included in a compressed attribute information file. In some embodiments, the compressed attribute information file may include one or more assigned values for one or more corresponding attributes of the starting point. In some embodiments, a prediction evaluator, such as prediction evaluator 924, may assign values to one or more attributes of a starting point in a decompressed model of a point cloud being decompressed based on assigned values for the starting point included in a compressed attribute information file. A prediction evaluator, such as prediction evaluator 924, may further utilize the assigned values of the attributes of the starting point to determine attribute values of neighboring points. For example, a prediction evaluator may select a next nearest neighboring point to the starting point as a next point to evaluate, wherein the next nearest neighboring point is selected based on a shortest distance to a neighboring point from the starting point.

Once the prediction evaluator has identified the "K" nearest neighboring points to a point being evaluated, the prediction evaluator may predict one or more attribute values for one or more attributes of the point being evaluated based on attribute values of corresponding attributes of the "K" nearest neighboring points. In some embodiments, an inverse distance interpolation technique may be used to predict an attribute value of a point being evaluated based on attribute values of neighboring points, wherein attribute values of neighboring points that are at a closer distance to the point being evaluated are weighted more heavily than attribute values of neighboring points that are at further distances from the point being evaluated.

A prediction evaluator, such as prediction evaluator 924, may apply an attribute correction value to a predicted attribute value to determine an attribute value to include for the point in a decompressed point cloud. In some embodiments, an attribute correction value for an attribute of a point may be included in a compressed attribute information file. In some embodiments, attribute correction values may be encoded using one of a plurality of supported coding contexts, wherein different coding contexts are selected to encode different attribute correction values based on a number of symbols included in the attribute correction value. In some embodiments, a decoder, such as decoder 920, may include a context store, such as context store 932, wherein the context store stores a plurality of encoding context that may be used to decode assigned attribute values or attribute correction values that have been encoded using corresponding encoding contexts at an encoder.

A decoder, such as decoder 920, may provide a decompressed LOD of a point cloud generated based on a received compressed point cloud and/or a received compressed attribute information file to a receiving device or application via a decoded data interface, such as decoded data interface 930. The decompressed LOD of the point cloud may include the points of the point cloud selected to be included in the given LOD and attribute values for attributes of the points of the given LOD. In some embodiments, a decoder may decode some attribute values for attributes of a point cloud without decoding other attribute values for other attributes of a point cloud. For example, a point cloud may include color attributes for points of the point cloud and may also include other attributes for the points of the point cloud, such as velocity, for example. In such a situation, a decoder may decode one or more attributes of the points of the point cloud, such as the velocity attribute, without decoding other attributes of the points of the point cloud, such as the color attributes.

In some embodiments, the decompressed point cloud and/or decompressed attribute information file for a given may be used to generate a visual display, such as for a head mounted display. Also, in some embodiments, the decompressed point cloud and/or decompressed attribute information file may be provided to a decision making engine that uses the decompressed point cloud and/or decompressed attribute information file to make one or more control decisions. In some embodiments, the decompressed point cloud and/or decompressed attribute information file may be used in various other applications or for various other purposes.

FIG. 10 illustrates an example compressed attribute information file, according to some embodiments. Attribute information file 1000 includes configuration information 1002, point cloud sampling parameters 1004 for a first LOD, point cloud data 1006 for the first LOD, and point attribute correction values 1008 for the first LOD. Attribute file 1000 also includes point cloud sampling parameters 1010 for another LOD, point cloud data 1012 for the second LOD, and point attribute correction values 1014 for the points included in the second LOD. In some embodiments, attribute information file 1000 may include information for any number of LODs. In some embodiments, point cloud file 1000 may be communicated in parts via multiple packets. In some embodiments, not all of the sections shown in attribute information file 1000 may be included in each packet transmitting compressed attribute information. In some embodiments, an attribute information file, such as attribute information file 1000, may be stored in a storage device, such as a server that implements an encoder or decoder, or other computing device.

Figure 11:
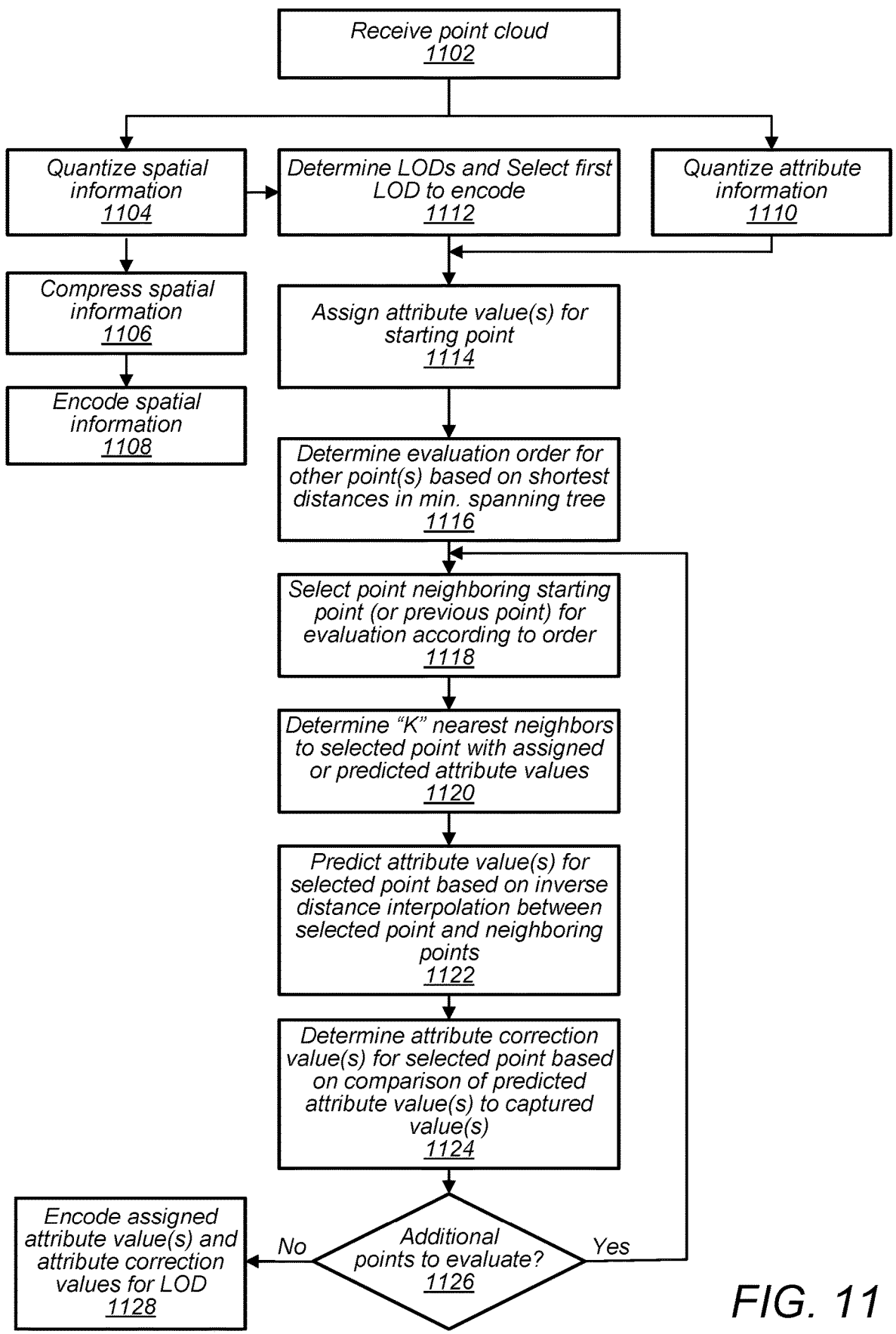
FIG. 11 illustrates an example process of compressing attribute information for a level of detail (LOD) based on a nearest neighbor prediction and prediction correction technique, according to some embodiments.

FIG. 11 illustrates a process for compressing attribute information of a point cloud, according to some embodiments.

At 1102, an encoder receives a point cloud that includes attribute information for at least some of the points of the point cloud. The point cloud may be received from one or more sensors that capture the point cloud, or the point cloud may be generated in software. For example, a virtual reality or augmented reality system may have generated the point cloud.

At 1104, the spatial information of the point cloud, for example X, Y, and Z coordinates for the points of the point cloud may be quantized. In some embodiments, coordinates may be rounded off to the nearest measurement unit, such as a meter, centimeter, millimeter, etc.

At 1106, the quantized spatial information is compressed. In some embodiments, spatial information may be compressed using a sub-sampling and subdivision prediction technique as discussed in more detail in regard to FIGS. 12A-B. Also, in some embodiments, spatial information may be compressed using a K-D tree compression technique as discussed in more detail in regard to FIG. 13, or may be compressed using an Octree compression technique. In some embodiments, other suitable compression techniques may be used to compress spatial information of a point cloud.

At 1108, the compressed spatial information for the point cloud is encoded as a compressed point cloud file or a portion of a compressed point cloud file. In some embodiments, compressed spatial information and compressed attribute information may be included in a common compressed point cloud file, or may be communicated or stored as separate files.

At 1112, the received spatial information of the point cloud is used to generate levels of detail for the point cloud. In some embodiments, the spatial information of the point cloud may be quantized before generating the levels of detail. Additionally, in some embodiments wherein a lossy compression technique is used to compress the spatial information of the point cloud, the spatial information may be lossy encoded and lossy decoded prior to generating the levels of detail. In embodiments that utilize lossy compression for spatial information, encoding and decoding the spatial information at the encoder may ensure that levels of detail generated at the encoder will match levels of detail that will be generated at a decoder using decoded spatial information that was previously lossy encoded.

Additionally, in some embodiments, at 1110, attribute information for points of the point cloud may be quantized. For example attribute values may be rounded to whole numbers or to particular measurement increments. In some embodiments wherein attribute values are integers, such as when integers are used to communicate string values, such as "walking", "running", "driving", etc., quantization at 1110 may be omitted.

At 1114, attribute values for a starting point are assigned. The assigned attribute values for the starting point are encoded in a compressed attribute information file along with attribute correction values. Because a decoder predicts attribute values based on distances to neighboring points and attribute values of neighboring points, at least one attribute value for at least one point is explicitly encoded in a compressed attribute file. In some embodiments, points of a point cloud may comprise multiple attributes and at least one attribute value for each type of attribute may be encoded for at least one point of the point cloud, in such embodiments. In some embodiments, a starting point may be a first point evaluated for a first LOD determined at 1112. In some embodiments, an encoder may encode data indicating spatial information for a starting point and/or other indicia of which point of the point cloud is the starting point or starting points. Additionally, the encoder may encode attribute values for one or more attributes of the starting point. In some embodiments, a starting point may be encoded for each LOD or a single starting point may be encoded for a first LOD and predicted values from lower level LODs may be used to predict higher level LODs.

At 1116, the encoder determines an evaluation order for predicting attribute values for other points of the point cloud, other than the starting point, said predicting and determining attribute correction values, may be referred to herein as "evaluating" attributes of a point. The evaluation order may be determined based on a shortest distance from the starting point to an adjacent neighboring point, wherein the closest neighboring point is selected as the next point in the evaluation order. In some embodiments, an evaluation order may be determined only for a next point to evaluate. In other embodiments, an evaluation order for all or multiple ones of the points of the point cloud may be determined at 1116. In some embodiments, an evaluation order may be determined on the fly, e.g. one point at a time as the points are evaluated. In some embodiments points may be evaluated in an evaluation order that corresponds to an order of the points in an index generated based on a space filling curve, such as a Morton order.

At 1118, a neighboring point of the starting point or of a subsequent point being evaluated is selected. In some embodiments, a neighboring point to be next evaluated may be selected based on the neighboring point being at a shortest distance from a point last evaluated, as compared to other neighboring points of the point last evaluated. In some embodiments, a point selected at 1118 may be selected based on an evaluation order determined at 1116. In some embodiments, an evaluation order may be determined on the fly, e.g. one point at a time as the points are evaluated. For example, a next point in the evaluation order may be determined each time a next point to be evaluated is selected at 1118. In such embodiments, 1116 may be omitted. Because points are evaluated in an order wherein each next point to be evaluated is at a shortest distance from a point last evaluated, entropy between attribute values of the points being evaluated may be minimized. This is because points adjacent to one another are most likely to have similar attributes. Though in some circumstances, adjacent points may have varying levels of similarity between attributes.

At 1120, the "K" nearest neighboring points to the point currently being evaluated are determined. The parameter "K" may be a configurable parameter selected by an encoder or provided to an encoder as a user configurable parameter. In order to select the "K" nearest neighboring points, an encoder may identify the first "K" nearest points to a point being evaluated according to a minimum spanning tree. In some embodiments, only points having assigned attribute values or for which predicted attribute values have already been determined may be included in the "K" nearest neighboring points. In some embodiments various numbers of points may identified. For example, in some embodiments, "K" may be 5 points, 10 points, 16 points, etc. Because a point cloud comprises points in 3-D space a particular point may have multiple neighboring points in multiple planes. In some embodiments, an encoder and a decoder may be configured to identify points as the "K" nearest neighboring points regardless of whether or not a value has already been predicted for the point. Also, in some embodiments, attribute values for points used in predication may be previously predicted attribute values or corrected predicted attribute values that have been corrected based on applying an attribute correction value. In either case, an encoder and a decoder may be configured to apply the same rules when identifying the "K" nearest neighboring points and when predicting an attribute value of a point based on attribute values of the "K" nearest neighboring points.

At 1122, one or more attribute values are determined for each attribute of the point currently being evaluated. The attribute values may be determined based on an inverse distance interpolation. The inverse distance interpolation may interpolate the predicted attribute value based on the attribute values of the "K" nearest neighboring points. The attribute values of the "K" nearest neighboring points may be weighted based on respective distances between respective ones of the "K" nearest neighboring points and the point being evaluated. Attribute values of neighboring points that are at shorter distances from the point currently being evaluated may be weighted more heavily than attribute values of neighboring points that are at greater distances from the point currently being evaluated.

At 1124, attribute correction values are determined for the one or more predicted attribute values for the point currently being evaluated. The attribute correction values may be determined based on comparing the predicted attribute values to corresponding attribute values for the same point (or a similar point) in the point cloud prior to attribute information compression. In some embodiments, quantized attribute information, such as the quantized attribute information generated at 1110, may be used to determine attribute correction values. In some embodiments, an attribute correction value may also be referred to as a "residual error" wherein the residual error indicates a difference between a predicted attribute value and an actual attribute value.

At 1126, it is determined if there are additional points in the LOD or additional LODs in the point cloud for which attribute correction values are to be determined. If there are additional points to evaluate, the process reverts to 1118 and the next point in the evaluation order is selected to be evaluated, or the next LOD is selected. As discussed above, in some embodiments an evaluation order may be determined on the fly, e.g. one point at a time as the points are evaluated. Thus, in such embodiments, a minimum spanning tree may be consulted to select a next point to evaluate based on the next point being at the shortest distance from the point last evaluated. The process may repeat steps 1118-1126 until all or a portion of all of the points of the point cloud have been evaluated to determine predicted attribute values and attribute correction values for the predicted attribute values.

At 1128, the determined attribute correction values, the assigned attribute values, and any configuration information for decoding the compressed attribute information file, such as a parameter "K", is encoded.

The attribute correction values, the assigned attribute values, and any configuration information may be encoded using various encoding techniques.

Figures 12A, 12B:
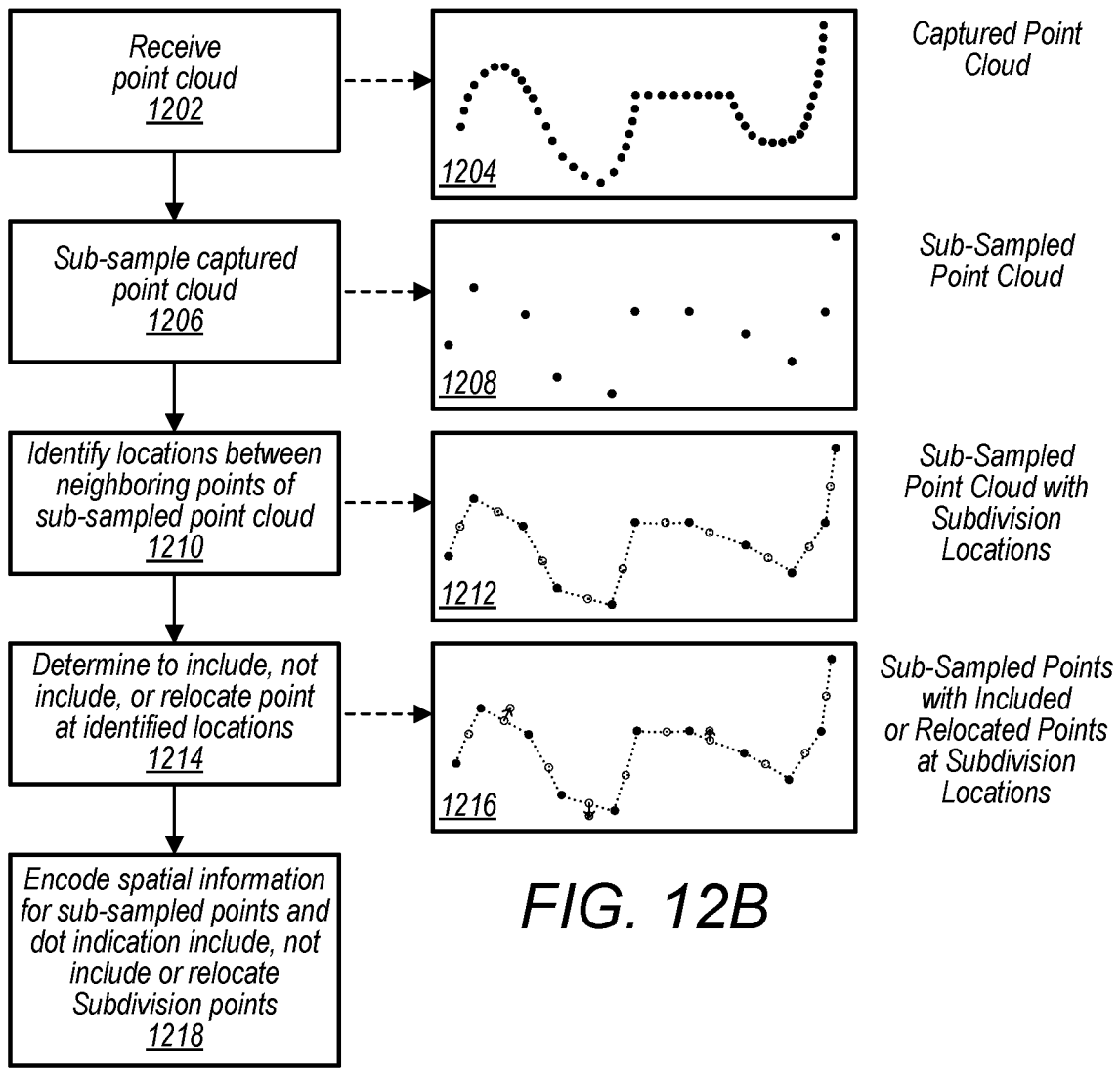
FIGS. 12A-B illustrates an example process for compressing spatial information of a point cloud, according to some embodiments.

FIGS. 12A-B illustrate an example process for compressing spatial information of a point cloud, according to some embodiments.

At 1202, an encoder receives a point cloud. The point cloud may be a captured point cloud from one or more sensors or may be a generated point cloud, such as a point cloud generated by a graphics application. For example, 1204 illustrates points of an un-compressed point cloud.

At 1206, the encoder sub-samples the received point cloud to generate a sub-sampled point cloud. The sub-sampled point cloud may include fewer points than the received point cloud. For example, the received point cloud may include hundreds of points, thousands of points, or millions of points and the sub-sampled point cloud may include tens of points, hundreds of points or thousands of points. For example, 1208 illustrates sub-sampled points of a point cloud received at 1202, for example a sub-sampling of the points of the point cloud in 1204.

In some embodiments, the encoder may encode and decode the sub-sampled point cloud to generate a representative sub-sampled point cloud the decoder will encounter when decoding the compressed point cloud. In some embodiments, the encoder and decoder may execute a lossy compression/decompression algorithm to generate the representative sub-sampled point cloud. In some embodiments, spatial information for points of a sub-sampled point cloud may be quantized as part of generating a representative sub-sampled point cloud. In some embodiments, an encoder may utilize lossless compression techniques and encoding and decoding the sub-sampled point cloud may be omitted. For example, when using lossless compression techniques the original sub-sampled point cloud may be representative of a sub-sampled point cloud the decoder will encounter because in lossless compression data may not be lost during compression and decompression.

At 1210, the encoder identifies subdivision locations between points of the sub-sampled point cloud according to configuration parameters selected for compression of the point cloud or according to fixed configuration parameters. The configuration parameters used by the encoder that are not fixed configuration parameters are communicated to an encoder by including values for the configuration parameters in a compressed point cloud. Thus, a decoder may determine the same subdivision locations as the encoder evaluated based on subdivision configuration parameters included in the compressed point cloud. For example, 1212 illustrates identified sub-division locations between neighboring points of a sub-sampled point cloud.

At 1214, the encoder determines for respective ones of the subdivision locations whether a point is to be included or not included at the subdivision location in a decompressed point cloud. Data indicating this determination is encoded in the compressed point cloud. In some embodiments, the data indicating this determination may be a single bit that if "true" means a point is to be included and if "false" means a point is not to be included. Additionally, an encoder may determine that a point that is to be included in a decompressed point cloud is to be relocated relative to the subdivision location in the decompressed point cloud. For example 1216, shows some points that are to be relocated relative to a subdivision location. For such points, the encoder may further encode data indicating how to relocate the point relative to the subdivision location. In some embodiments, location correction information may be quantized and entropy encoded. In some embodiments, the location correction information may comprise delta X, delta Y, and/or delta Z values indicating how the point is to be relocated relative to the subdivision location. In other embodiments, the location correction information may comprise a single scalar value which corresponds to the normal component of the location correction information computed as follows:

$$\Delta N = ([X_A, Y_A, Z_A] - [X, Y, Z]) \cdot [\text{Normal Vector}]$$

In the above equation, delta N is a scalar value indicating location correction information that is the difference between the relocated or adjusted point location relative to the subdivision location (e.g. $[X_A, Y_A, Z_A]$) and the original subdivision location (e.g. $[X, Y, Z]$). The cross product of this vector difference and the normal vector at the subdivision location results in the scalar value delta N. Because a decoder can determine, the normal vector at the subdivision location, and can determine the coordinates of the subdivision location, e.g. $[X, Y, Z]$, the decoder can also determine the coordinates of the adjusted location, e.g. $[X_A, Y_A, Z_A]$, by solving the above equation for the adjusted location, which represents a relocated location for a point relative to the subdivision location. In some embodiments, the location correction information may be further decomposed into a normal component and one or more additional tangential components. In such an embodiment, the normal component, e.g. delta N, and the tangential component(s) may be quantized and encoded for inclusion in a compressed point cloud.

In some embodiments, an encoder may determine whether one or more additional points (in addition to points included at subdivision locations or points included at locations relocated relative to subdivision locations) are to be included in a decompressed point cloud. For example, if the original point cloud has an irregular surface or shape such that subdivision locations between points in the sub-sampled point cloud do not adequately represent the irregular surface or shape, the encoder may determine to include one or more additional points in addition to points determined to be included at subdivision locations or relocated relative to subdivision locations in the decompressed point cloud. Additionally, an encoder may determine whether one or more additional points are to be included in a decompressed point cloud based on system constraints, such as a target bitrate, a target compression ratio, a quality target metric, etc. In some embodiments, a bit budget may change due to changing conditions such as network conditions, processor load, etc. In such embodiments, an encoder may adjust a quantity of additional points that are encoded to be included in a decompressed point cloud based on a changing bit budget. In some embodiments, an encoder may include additional points such that a bit budget is consumed without being exceeded. For example, when a bit budget is higher, an encoder may include more additional points to consume the bit budget (and enhance quality) and when the bit budget is less, the encoder may include fewer additional points such that the bit budget is consumed but not exceeded.

In some embodiments, an encoder may further determine whether additional subdivision iterations are to be performed. If so, the points determined to be included, relocated, or additionally included in a decompressed point cloud are taken into account and the process reverts to 1210 to identify new subdivision locations of an updated sub-sampled point cloud that includes the points determined to be included, relocated, or additionally included in the decompressed point cloud. In some embodiments, a number of subdivision iterations to be performed (N) may be a fixed or configurable parameter of an encoder. In some embodiments, different subdivision iteration values may be assigned to different portions of a point cloud. For example, an encoder may take into account a point of view from which the point cloud is being viewed and may perform more subdivision iterations on points of the point cloud in the foreground of the point cloud as viewed from the point of view and fewer subdivision iterations on points in a background of the point cloud as viewed from the point of view.

At 1218, the spatial information for the sub-sampled points of the point cloud are encoded. Additionally, subdivision location inclusion and relocation data is encoded. Additionally, any configurable parameters selected by the encoder or provided to the encoder from a user are encoded. The compressed point cloud may then be sent to a receiving entity as a compressed point cloud file, multiple compressed point cloud files, or may be packetized and communicated via multiple packets to a receiving entity, such as a decoder or a storage device. In some embodiments, a compressed point cloud may comprise both compressed spatial information and compressed attribute information. In other embodiments, compressed spatial information and compressed attribute information may be included is separate compressed point cloud files.

Figure 13:
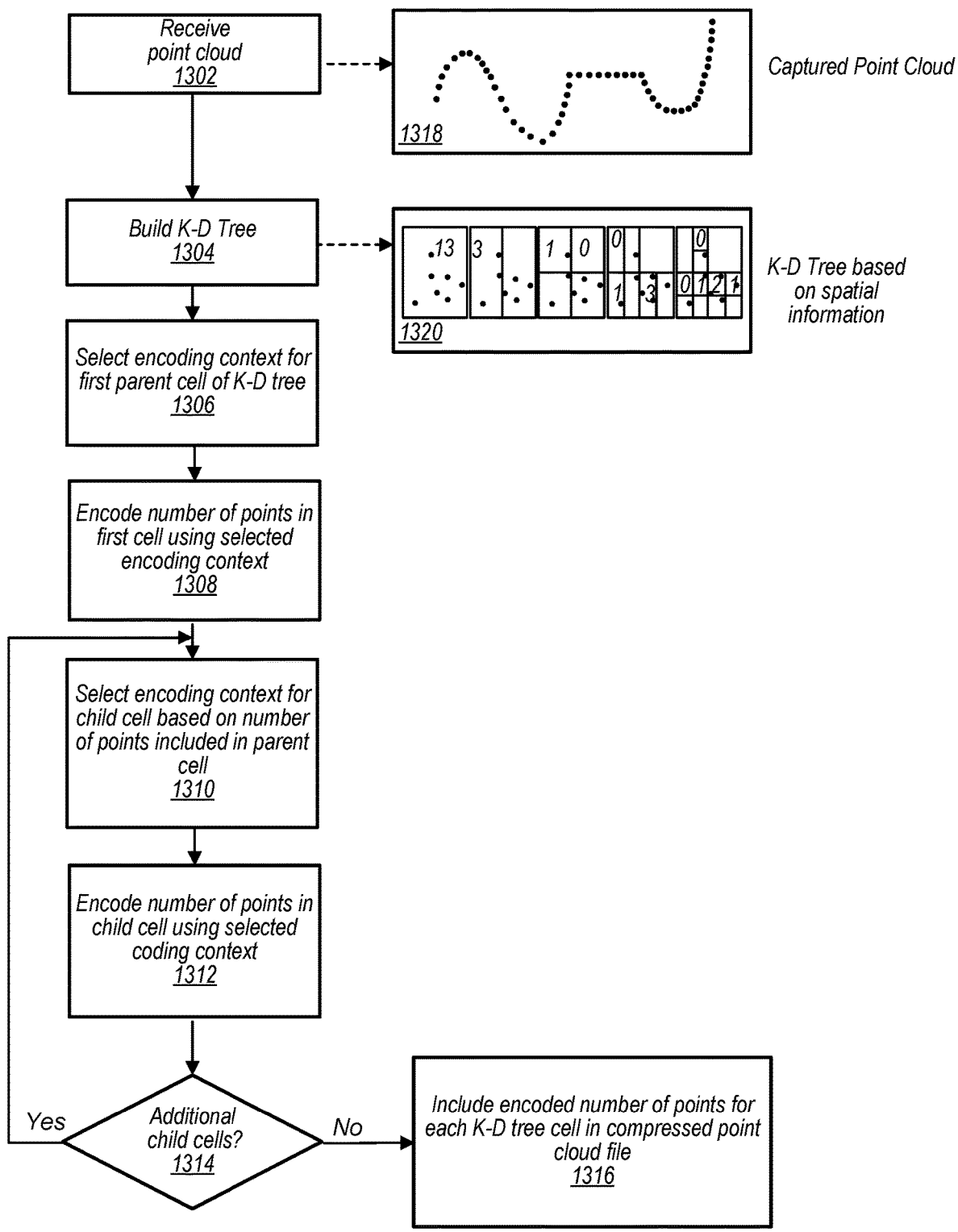
FIG. 13 illustrates another example process for compressing spatial information of a point cloud, according to some embodiments.

FIG. 13 illustrates another example process for compressing spatial information of a point cloud, according to some embodiments.

In some embodiments, other spatial information compression techniques other than the sub-sampling and prediction spatial information technique described in FIGS. 12A-B may be used. For example, a spatial encoder, such as spatial encoder 904, or a spatial decoder, such as spatial decoder 922, may utilize other spatial information compression techniques, such as a K-D tree spatial information compression technique. For example, compressing spatial information at 1106 of FIG. 11 may be performed using a sub-sampling and prediction technique similar to what is described in FIGS. 12A-B, may be performed using a K-D tree spatial information compression technique similar to what is described in FIG. 13, or may be performed using another suitable spatial information compression technique.

In a K-D tree spatial information compression technique, a point cloud comprising spatial information may be received at 1302. In some embodiments, the spatial information may have been previously quantized or may further be quantized after being received. For example 1318 illustrates a captured point cloud that may be received at 1302. For simplicity, 1318 illustrates a point cloud in two dimensions. However, in some embodiments, a received point cloud may include points in 3-D space.

At 1304, a K-dimensional tree or K-D tree is built using the spatial information of the received point cloud. In some embodiments, a K-D tree may be built by dividing a space, such as a 1-D, 2-D, or 3-D space of a point cloud in half in a predetermined order. For example, a 3-D space comprising points of a point cloud may initially be divided in half via a plane intersecting one of the three axis, such as the X-axis. A subsequent division may then divide the resulting space along another one of the three axis, such as the Y-axis. Another division may then divide the resulting space along another one of the axis, such as the Z-axis. Each time a division is performed a number of points included in a child cell created by the division may be recorded. In some embodiments, only a number of points in one child cell of two child cells resulting from a division may be recorded. This is because a number of points included in the other child cell can be determined by subtracting the number of points in the recorded child cell from a total number of points in a parent cell prior to the division.

A K-D tree may include a sequence of number of points included in cells resulting from sequential divisions of a space comprising points of a point cloud. In some embodiments, building a K-D tree may comprise continuing to subdivide a space until only a single point is included in each lowest level child cell. A K-D tree may be communicated as a sequence of number of points in sequential cells resulting from sequential divisions. A decoder may be configured with information indicating the subdivision sequence followed by an encoder. For example, an encoder may follow a pre-defined division sequence until only a single point remains in each lowest level child cell. Because the decoder may know the division sequence that was followed to build the K-D tree and the number of points that resulted from each subdivision (which is communicated to the decoder as compressed spatial information) the decoder may be able to reconstruct the point cloud.

For example, 1320 illustrates a simplified example of K-D compression in a two-dimensional space. An initial space includes seven points. This may be considered a first parent cell and a K-D tree may be encoded with a number of points "7" as a first number of the K-D tree indicating that there are seven total points in the K-D tree. A next step may be to divide the space along the X-axis resulting in two child cells, a left child cell with three points and a right child cell with four points. The K-D tree may include the number of points in the left child cell, for example "3" as a next number of the K-D tree. Recall that the number of points in the right child cell can be determined based on subtracting the number of points in the left child cell from the number of points in the parent cell. A further step may be to divide the space an additional time along the Y-axis such that each of the left and right child cells are divided in half into lower level child cells. Again, a number of points included in the left lower-level child cells may be included in a K-D tree, for example "0" and "1". A next step may then be to divide the non-zero lower-level child cells along the X-axis and record the number of points in each of the lower-level left child cells in a K-D tree. This process may continue until only a single point remains in a lowest level child cell. A decoder may utilize a reverse process to recreate a point cloud based on receiving a sequence of point totals for each left child cell of a K-D tree.

At 1306, an encoding context for encoding a number of points for a first cell of the K-D tree, for example the parent cell comprising seven points, is selected. In some embodiments, a context store may store hundreds or thousands of encoding contexts. In some embodiments, cells comprising more points than a highest number of points encoding context may be encoded using the highest number point encoding context. In some embodiments, an encoding context may include arithmetic encoding, Golomb exponential encoding, or a combination of the two. In some embodiments, other encoding techniques may be used. In some embodiments, an arithmetic encoding context may include probabilities for particular symbols, wherein different arithmetic encoding contexts include different symbol probabilities.

At 1308, the number of points for the first cell is encoded according the selected encoding context.

At 1310, an encoding context for encoding a child cell is selected based on a number of points included in a parent cell. The encoding context for the child cell may be selected in a similar manner as for the parent cell at 1306.

At 1312, the number of points included in the child cell is encoded according the selected encoding context, selected at 1310. At 1314, it is determined if there are additional lower-level child cells to encode in the K-D tree. If so, the process reverts to 1310. If not, at 1316, the encoded number of points in the parent cell and the child cells are included in a compressed spatial information file, such as a compressed point cloud. The encoded values are ordered in the compressed spatial information file such that the decoder may reconstruct the point cloud based on the number of points of each parent and child cell and the order in which the number of points of the respective cells are included in the compressed spatial information file.

In some embodiments, the number of points in each cell may be determined and subsequently encoded as a group at 1316. Or, in some embodiments, a number of points in a cell may be encoded subsequent to being determined without waiting for all child cell point totals to be determined.

Figure 14:
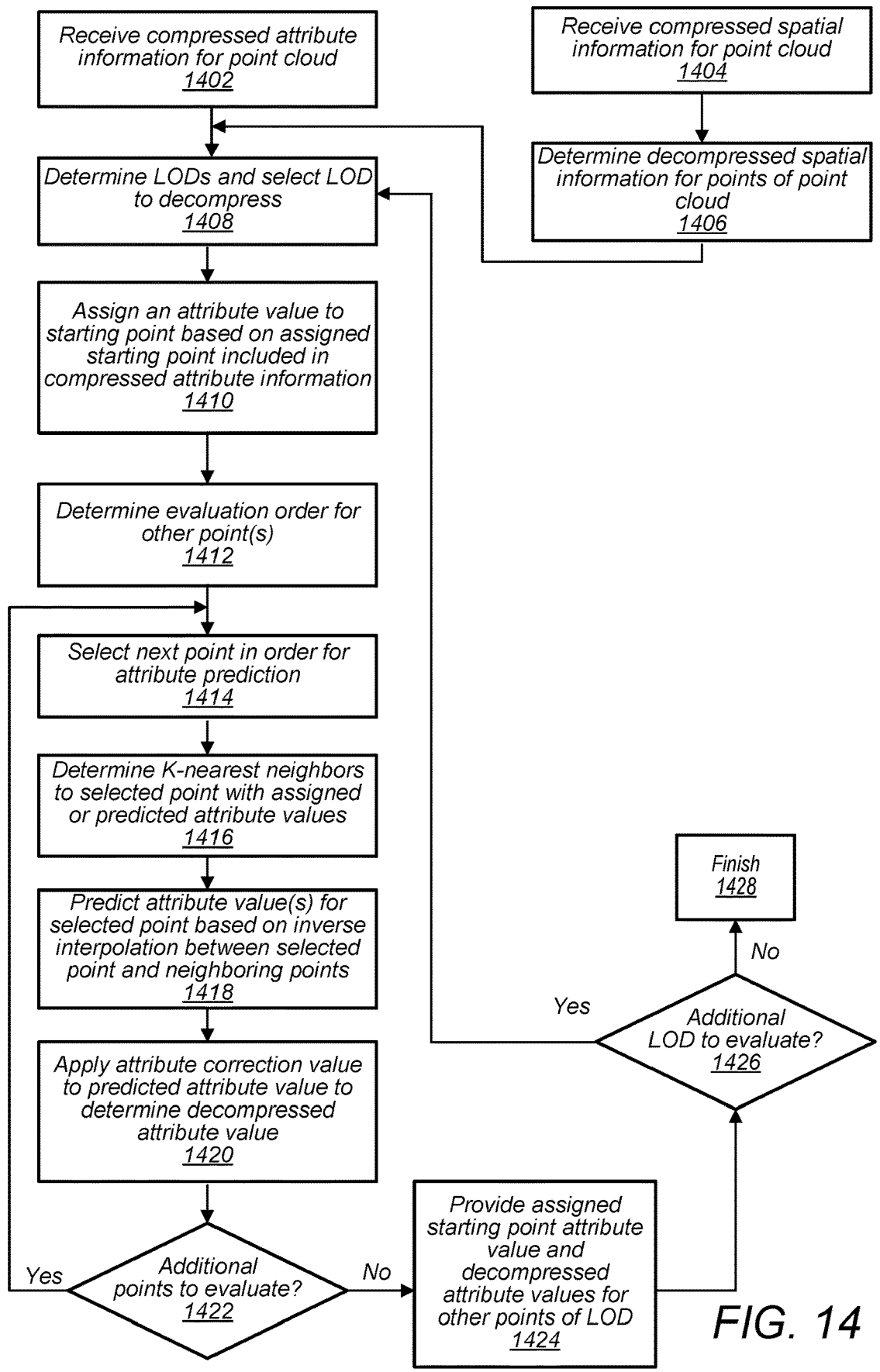
FIG. 14 illustrates an example process of decompressing attribute information for one or more levels of detail (LODs) based on a nearest neighbor prediction and prediction correction technique, according to some embodiments.

FIG. 14 illustrates an example process for decompressing compressed attribute information of a point cloud, according to some embodiments.

At 1402, a decoder receives compressed attribute information for a point cloud, and at 1404, the decoder receives compressed spatial information for the point cloud. In some embodiments, the compressed attribute information and the compressed spatial information may be included in one or more common files or separate files.

At 1406, the decoder decompresses the compressed spatial information. The compressed spatial information may have been compressed according to a sub-sampling and prediction technique and the decoder may perform similar sub-sampling, prediction, and prediction correction actions as were performed at the encoder and further apply correction values to the predicted point locations, to generate a non-compressed point cloud from the compressed spatial information. In some embodiments, the compressed spatial information may be compressed in a K-D tree format, and the decoder may generate a decompressed point cloud based on an encoded K-D tree included in the received spatial information. In some embodiments, the compressed spatial information may have been compressed using an Octree technique and an Octree decoding technique may be used to generate decompressed spatial information for the point cloud. In some embodiments, other spatial information compression techniques may have been used and may be decompressed via the decoder.

At 1408, the decoder may determine points to be included in various levels of detail, based on the decompressed spatial information. For example, compressed spatial information and/or compressed attribute information may be received via a encoded data interface of a decoder, such as encoded data interface 926 of decoder 920 illustrated in FIG. 9B. A spatial decoder, such as spatial decoder 922, may decompress the compressed spatial information, and a space filling curve LOD generator, such as space filling curve LOD generator 928, may generate LODs based on the decompressed spatial information.

At 1410, a prediction evaluator of a decoder, such as prediction evaluator 924 of decoder 920, may assign an attribute value to a starting point based on an assigned attribute value included in the compressed attribute information. In some embodiments, the compressed attribute information may identify a point as a starting point to be used for generating the minimum spanning tree and for predicting attribute values of the points according to an evaluation order based on the minimum spanning tree. The assigned attribute value or values for the starting point may be included in decompressed attribute information for a decompressed point cloud.

At 1412, the prediction evaluator of the decoder or another decoder component determines an evaluation order for at least the next point subsequent to the starting point that is to be evaluated. In some embodiments, an evaluation order may be determined for all or multiple ones of the points, or in other embodiments, an evaluation order may be determined point by point as attribute values are determined for the points. The points may be evaluated in an order based on minimum distances between successive points being evaluated. For example, a neighboring point at a shortest distance from a starting point as compared to other neighboring points may be selected as a next point to evaluate subsequent to the starting point. In a similar manner, other points may then be selected to be evaluated based on a shortest distance from a point that has most recently been evaluated. At 1414, the next point to evaluate is selected. In some embodiments 1412 and 1414 may be performed together.

At 1416, a prediction evaluator of a decoder determines the "K" nearest neighboring points to a point being evaluated. In some embodiments, neighboring points may only be included in the "K" nearest neighboring points if they already have assigned or predicted attribute values. In other embodiments, neighboring points may be included in the "K" nearest neighboring points without regard to whether they have assigned or already predicted attribute values. In such embodiments, an encoder may follow a similar rule as the decoder as to whether or not to include points without predicted values as neighboring points when identifying the "K" nearest neighboring points.

At 1418, predicted attribute values are determined for one or more attributes of the point being evaluated based on attribute values of the "K" nearest neighboring points and distances between the point being evaluated and respective ones of the "K" nearest neighboring points. In some embodiments, an inverse distance interpolation technique may be used to predict attribute values, wherein attribute values of points closer to a point being evaluated are weighted more heavily than attribute values of points that are further away from the point being evaluated. The attribute prediction technique used by a decoder may be the same as an attribute prediction technique used by an encoder that compressed the attribute information.

At 1420, a prediction evaluator of a decoder may apply an attribute correction value to a predicted attribute value of a point to correct the attribute value. The attribute correction value may cause the attribute value to match or nearly match an attribute value of an original point cloud prior to compression. In some embodiments, in which a point has more than one attribute, 1418 and 1420 may be repeated for each attribute of the point. In some embodiments, some attribute information may be decompressed without decompressing all attribute information for a point cloud or a point. For example, a point may include velocity attribute information and color attribute information. The velocity attribute information may be decoded without decoding the color attribute information and vice versa. In some embodiments, an application utilizing the compressed attribute information may indicate what attributes are to be decompressed for a point cloud.

At 1422, it is determined if there are additional points or LODs to evaluate. If so, the process reverts to 1414 and a next point or LOD to evaluate is selected. If there are not additional points to evaluate, at 1424, decompressed attribute information is provided, for example as a decompressed point cloud, wherein each point comprises spatial information and one or more attributes.

In some circumstances, a number of bits needed to encode attribute information for a point cloud may make up a significant portion of a bit stream for the point cloud. For example, the attribute information may make up a larger portion of the bit stream than is used to transmit compressed spatial information for the point cloud.

In some embodiments, spatial information may be used to build a hierarchical Level of Detail (LOD) structure. The LOD structure may be used to compress attributes associated with a point cloud. The LOD structure may also enable advanced functionalities such as progressive/view-dependent streaming and scalable rendering. For example, in some embodiments, compressed attribute information may be sent (or decoded) for only a portion of the point cloud (e.g. a level of detail) without sending (or decoding) all of the attribute information for the whole point cloud.

Figure 15:
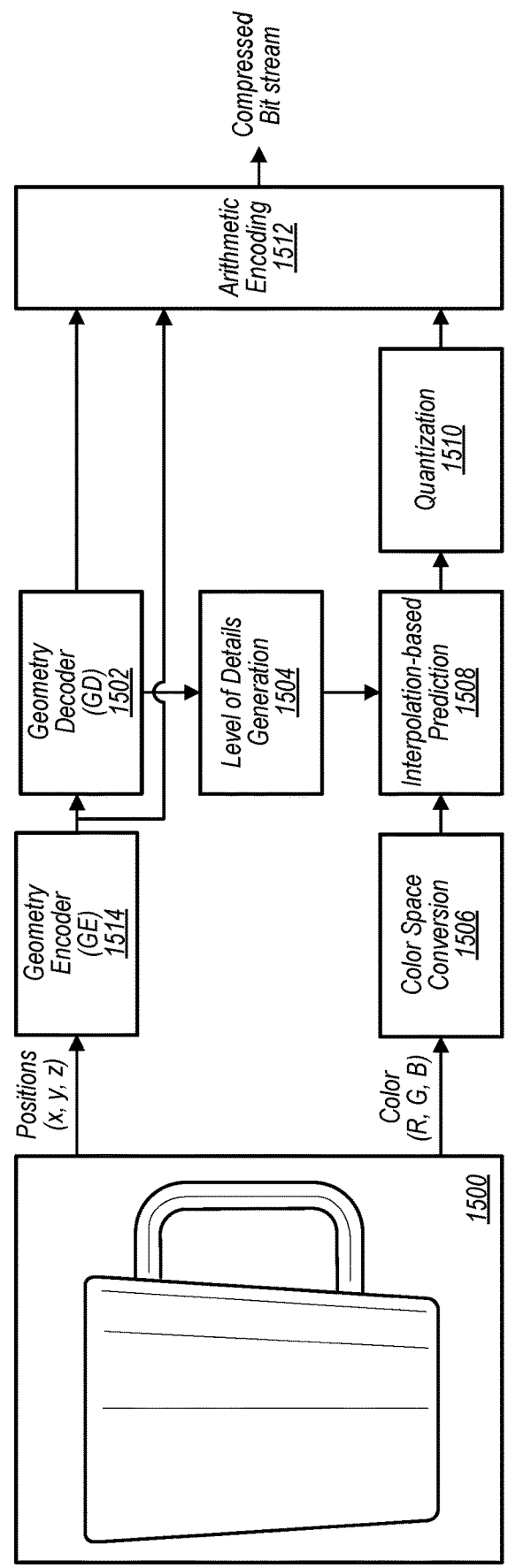
FIG. 15 illustrates an example encoder that generates compressed attribute information for multiple levels of detail (LODs) of a compressed point cloud, according to some embodiments.

FIG. 15 illustrates an example encoding process that generates a hierarchical LOD structure, according to some embodiments. For example, in some embodiments, an encoder such as encoder 902 may generate compressed attribute information in a LOD structure using a similar process as shown in FIG. 15.

In some embodiments, geometry information (also referred to herein as "spatial information") may be used to efficiently predict attribute information. For example, in FIG. 15 the compression of color information is illustrated. However, a LOD structure may be applied to compression of any type of attribute (e.g., reflectance, texture, modality, etc.) associated with points of a point cloud. Note that a pre-encoding step which applies color space conversion or updates the data to make the data better suited for compression may be performed depending on the attribute to be compressed.

In some embodiments, attribute information compression according to a LOD process proceeds as described below.

For example, let Geometry (G)={Point-P(0), P(1), . . . P(N−1)} be reconstructed point cloud positions generated by a spatial decoder included in an encoder (geometry decoder GD 1502) after decoding a compressed geometry bit stream produced by a geometry encoder, also included in the encoder (geometry encoder GE 1514), such as spatial encoder 904. For example, in some embodiments, an encoder such as encoder 902 may include both a geometry encoder, such as geometry encoder 1514, and a geometry decoder, such as geometry decoder 1514. In some embodiments, a geometry encoder may be part of spatial encoder 914 and a geometry decoder may be part of prediction/correction evaluator 906.

In some embodiments, the decompressed spatial information may describe locations of points in 3D space, such as X, Y, and Z coordinates of the points that make up mug 1500. Note that spatial information may be available to both an encoder, such as encoder 902, and a decoder, such as decoder 920. For example various techniques, such as K-D tree compression, octree compression, nearest neighbor prediction, etc., may be used to compress and/or encode spatial information for mug 1500 and the spatial information may be sent to a decoder with, or in addition to, compressed attribute information for attributes of the points that make up a point cloud for mug 1500.

In some embodiments, a deterministic re-ordering process may be applied on both an encoder side (such as at encoder 902) and at a decoder side (such as at decoder 920) in order to organize points of a point cloud, such as the points that represent mug 1500, in a set of Level of Details (LODs). For example, levels of detail may be generated by a level of detail generator 1504, which may be included in a prediction/correction evaluator of an encoder, such as prediction/correction evaluator 906 of encoder 902. In some embodiments, a level of detail generator 1504 may be a separate component of an encoder, such as encoder 902. For example, level of detail generator 1504 may be a separate component of encoder 902.

In some embodiments, an encoder as described above may further include a quantization module (not shown) that quantizes geometry information included in the "positions (x,y,z) being provided to the geometry encoder 1514. Furthermore, in some embodiments, an encoder as described above may additionally include a module that removes duplicated points subsequent to quantization and before the geometry encoder 1514.

In some embodiments, quantization may further be applied to compressed attribute information, such as attribute correction values and/or one or more attribute value starting points. For example quantization is performed at 1510 to attribute correction values determined by interpolation-based prediction module 1508. Quantization techniques may include uniform quantization, uniform quantization with a dead zone, non-uniform/non-linear quantization, trellis quantization, or other suitable quantization techniques.

Example Level of Detail Hierarchy

Figure 16:
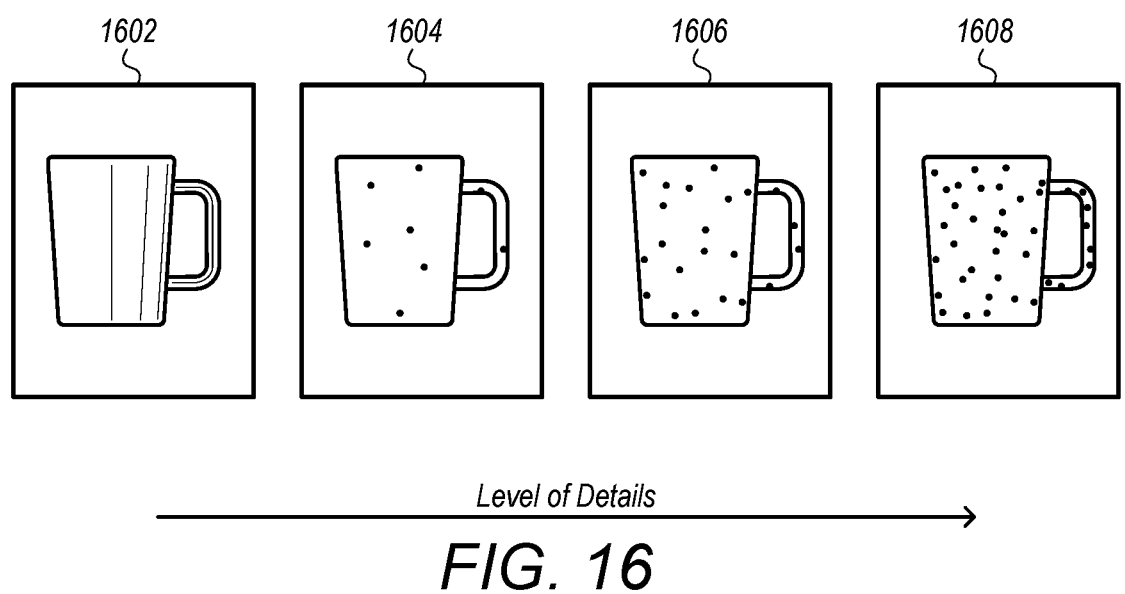
FIG. 16 illustrates an example level of detail (LOD) structure, according to some embodiments.

FIG. 16 illustrates an example LOD, according to some embodiments. Note that the LOD generation process may generate uniformly or near-uniformly sampled approximations (or levels of detail) of the original point cloud, that get refined as more and more points are included. Such a feature makes it particularly adapted for progressive/view-dependent transmission and scalable rendering. For example, 1604 may include more detail than 1602, and 1606 may include more detail than 1604. Also, 1608 may include more detail than 1602, 1604, and 1606.

The hierarchical LOD structure may be used to build an attribute prediction strategy. For example, in some embodiments the points may be encoded in the same order as they were visited during the LOD generation phase. Attributes of each point may be predicted by using the K-nearest neighbors that have been previously encoded. In some embodiments, "K" is a parameter that may be defined by the user or may be determined by using an optimization strategy. "K" may be static or adaptive. In the latter case where "K" is adaptive, extra information describing the parameter may be included in the bit stream.

In some embodiments, different prediction strategies may be used. For example, one of the following interpolation strategies may be used, as well as combinations of the following interpolation strategies, or an encoder/decoder may adaptively switch between the different interpolation strategies. The different interpolation strategies may include interpolation strategies such as: inverse-distance interpolation, barycentric interpolation, natural neighbor interpolation, moving least squares interpolation, or other suitable interpolation techniques. For example, interpolation based prediction may be performed at an interpolation-based prediction module 1508 included in a prediction/correction value evaluator of an encoder, such as prediction/correction value evaluator 906 of encoder 902. Also, interpolation based prediction may be performed at an interpolation-based prediction module 1508 included in a prediction evaluator of a decoder, such as prediction evaluator 924 of decoder 920. In some embodiments, a color space may also be converted, at color space conversion module 1506, prior to performing interpolation based prediction. In some embodiments, a color space conversion module 1506 may be included in an encoder, such as encoder 902. In some embodiments, a decoder may further included a module to convert a converted color space, back to an original color space.

In some embodiments, quantization may further be applied to attribute information. For example quantization may performed at quantization module 1510. In some embodiments, an encoder, such as encoder 902, may further include a quantization module 1510. Quantization techniques employed by a quantization module 1510 may include uniform quantization, uniform quantization with a dead zone, non-uniform/non-linear quantization, trellis quantization, or other suitable quantization techniques.

In some embodiments, LOD attribute compression may be used to compress dynamic point clouds as follows:

Let FC be the current point cloud frame and RF be the reference point cloud.

Let M be the motion field that deforms RF to take the shape of FC.

M may be computed on the decoder side and in this case information may not be encoded in the bit stream.

M may be computed by the encoder and explicitly encoded in the bit stream

M may be encoded by applying a hierarchical compression technique as described herein to the motion vectors associated with each point of RF (e.g. the motion of RF may be considered as an extra attribute).

M may be encoded as a skeleton/skinning-based model with associated local and global transforms.

M may be encoded as a motion field defined based on an octree structure, which is adaptively refined to adapt to motion field complexity.

M may be described by using any suitable animation technique such as key-frame-based animations, morphing techniques, free-form deformations, key-point-based deformation, etc.

Let RF' be the point cloud obtained after applying the motion field M to RF. The points of RF' may be then used in the attribute prediction strategy by considering not only the "K" nearest neighbor points of FC but also those of RF'.

Furthermore, attribute correction values may be determined based on comparing the interpolation-based prediction values determined at interpolation-based prediction module 1508 to original non-compressed attribute values. The attribute correction values may further be quantized at quantization module 1510 and the quantitated attribute correction values, encoded spatial information (output from the geometry encoder 1502) and any configuration parameters used in the prediction may be encoded at arithmetic encoding module 1512. In some embodiments, the arithmetic encoding module, may use a context adaptive arithmetic encoding technique. The compressed point cloud may then be provided to a decoder, such as decoder 920, and the decoder may determine similar levels of detail and perform interpolation based prediction to recreate the original point cloud based on the quantized attribute correction values, encoded spatial information (output from the geometry encoder 1502) and the configuration parameters used in the prediction at the encoder.

Example Applications for Point Cloud Compression and Decompression

Figure 17:
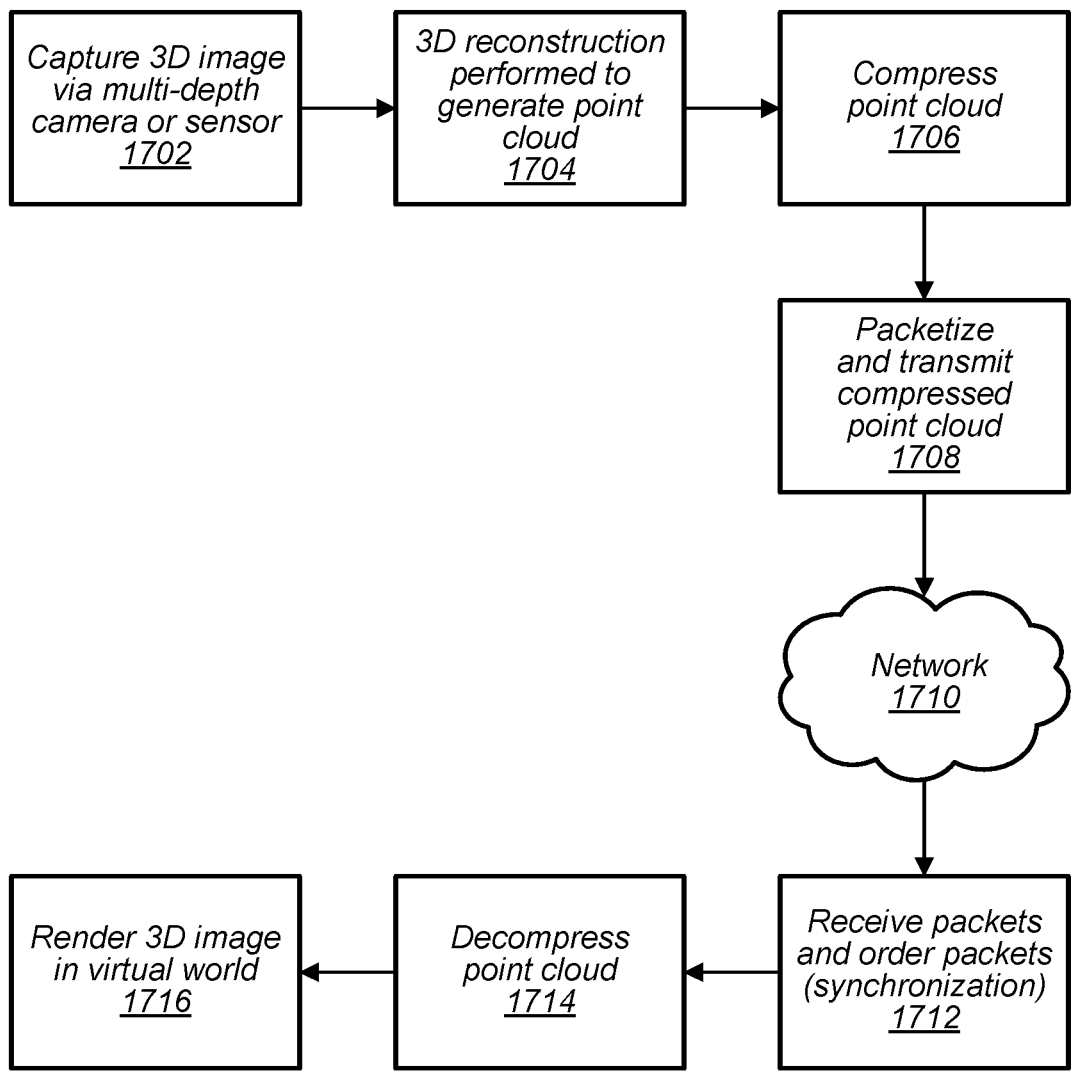
FIG. 17 illustrates compressed point cloud information being used in a 3-D application, according to some embodiments.

FIG. 17 illustrates compressed point clouds being used in a 3-D telepresence application, according to some embodiments.

In some embodiments, a sensor, such as sensor 102, an encoder, such as encoder 104 or encoder 902, and a decoder, such as decoder 116 or decoder 920, may be used to communicate point clouds in a 3-D application. For example, a sensor, such as sensor 102, at 1702 may capture a 3D image and at 1704, the sensor or a processor associated with the sensor may perform a 3D reconstruction based on sensed data to generate a point cloud.

At 1706, an encoder such as encoder 104 or 902 may compress the point cloud and at 1708 the encoder or a post processor may packetize and transmit the compressed point cloud, via a network 1710. At 1712, the packets may be received at a destination location that includes a decoder, such as decoder 116 or decoder 920. The decoder may decompress the point cloud at 1714 and the decompressed point cloud may be rendered at 1716. In some embodiments a 3-D application may transmit point cloud data in real time such that a display at 1716 represents images being observed at 1702. For example, a camera in a canyon may allow a remote user to experience walking through a virtual canyon at 1716.

Figure 18:
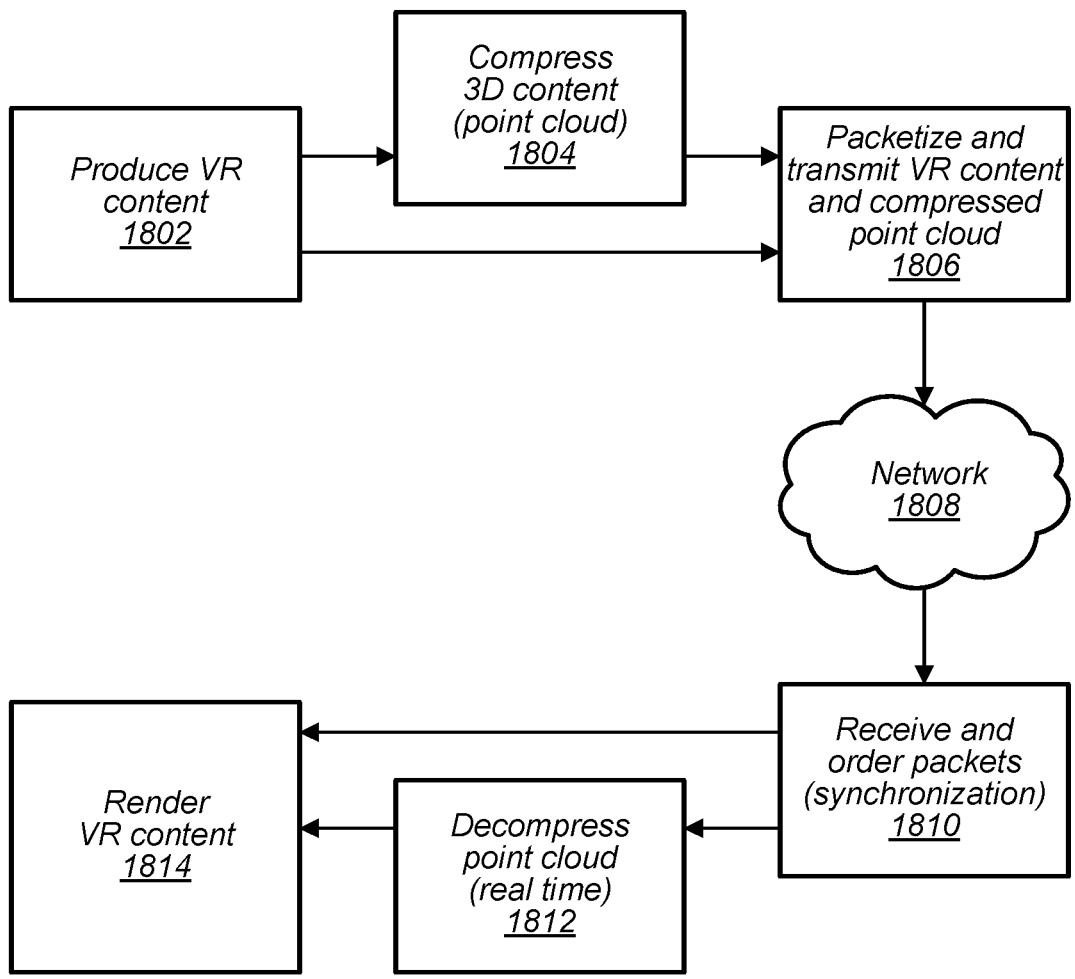
FIG. 18 illustrates compressed point cloud information being used in a virtual reality application, according to some embodiments.

FIG. 18 illustrates compressed point clouds being used in a virtual reality (VR) or augmented reality (AR) application, according to some embodiments.

In some embodiments, point clouds may be generated in software (for example as opposed to being captured by a sensor). For example, at 1802 virtual reality or augmented reality content is produced. The virtual reality or augmented reality content may include point cloud data and non-point cloud data. For example, a non-point cloud character may traverse a landscape represented by point clouds, as one example. At 1804, the point cloud data may be compressed and at 1806 the compressed point cloud data and non-point cloud data may be packetized and transmitted via a network 1808. For example, the virtual reality or augmented reality content produced at 1802 may be produced at a remote server and communicated to a VR or AR content consumer via network 1808. At 1810, the packets may be received and synchronized at the VR or AR consumer's device. A decoder operating at the VR or AR consumer's device may decompress the compressed point cloud at 1812 and the point cloud and non-point cloud data may be rendered in real time, for example in a head mounted display of the VR or AR consumer's device. In some embodiments, point cloud data may be generated, compressed, decompressed, and rendered responsive to the VR or AR consumer manipulating the head mounted display to look in different directions.

In some embodiments, point cloud compression as described herein may be used in various other applications, such as geographic information systems, sports replay broadcasting, museum displays, autonomous navigation, etc.

Example Computer System

Figure 19:
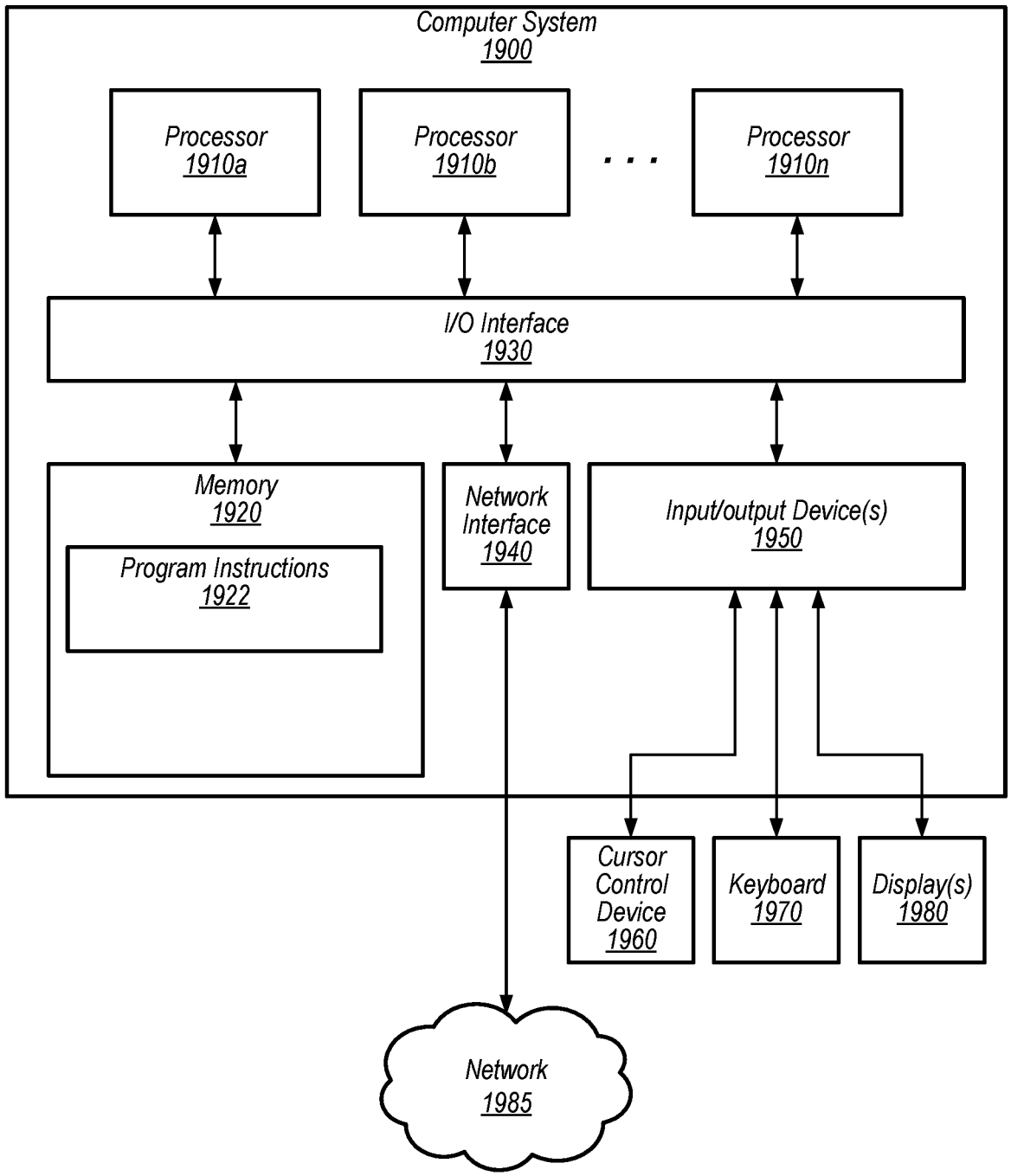
FIG. 19 illustrates an example computer system that may implement an encoder or decoder, according to some embodiments.

FIG. 19 illustrates an example computer system 1900 that may implement an encoder or decoder or any other ones of the components described herein, (e.g., any of the components described above with reference to FIGS. 1-18), in accordance with some embodiments. The computer system 1900 may be configured to execute any or all of the embodiments described above. In different embodiments, computer system 1900 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, a consumer device, video game console, handheld video game device, application server, storage device, a television, a video recording device, a peripheral device such as a switch, modem, router, or in general any type of computing or electronic device.

Various embodiments of a point cloud encoder or decoder, as described herein may be executed in one or more computer systems 1900, which may interact with various other devices. Note that any component, action, or functionality described above with respect to FIGS. 1-18 may be implemented on one or more computers configured as computer system 1900 of FIG. 19, according to various embodiments. In the illustrated embodiment, computer system 1900 includes one or more processors 1910 coupled to a system memory 1920 via an input/output (I/O) interface 1930. Computer system 1900 further includes a network interface 1940 coupled to I/O interface 1930, and one or more input/output devices 1950, such as cursor control device 1960, keyboard 1970, and display(s) 1980. In some cases, it is contemplated that embodiments may be implemented using a single instance of computer system 1900, while in other embodiments multiple such systems, or multiple nodes making up computer system 1900, may be configured to host different portions or instances of embodiments. For example, in one embodiment some elements may be implemented via one or more nodes of computer system 1900 that are distinct from those nodes implementing other elements.

In various embodiments, computer system 1900 may be a uniprocessor system including one processor 1910, or a multiprocessor system including several processors 1910 (e.g., two, four, eight, or another suitable number). Processors 1910 may be any suitable processor capable of executing instructions. For example, in various embodiments processors 1910 may be general-purpose or embedded processors implementing any of a variety of instruction set architectures (ISAs), such as the x86, PowerPC, SPARC, or MIPS ISAs, or any other suitable ISA. In multiprocessor systems, each of processors 1910 may commonly, but not necessarily, implement the same ISA.

System memory 1920 may be configured to store point cloud compression or point cloud decompression program instructions 1922 and/or sensor data accessible by processor 1910. In various embodiments, system memory 1920 may be implemented using any suitable memory technology, such as static random access memory (SRAM), synchronous dynamic RAM (SDRAM), nonvolatile/Flash-type memory, or any other type of memory. In the illustrated embodiment, program instructions 1922 may be configured to implement an image sensor control application incorporating any of the functionality described above. In some embodiments, program instructions and/or data may be received, sent or stored upon different types of computer-accessible media or on similar media separate from system memory 1920 or computer system 1900. While computer system 1900 is described as implementing the functionality of functional blocks of previous Figures, any of the functionality described herein may be implemented via such a computer system.

In one embodiment, I/O interface 1930 may be configured to coordinate I/O traffic between processor 1910, system memory 1920, and any peripheral devices in the device, including network interface 1940 or other peripheral interfaces, such as input/output devices 1950. In some embodiments, I/O interface 1930 may perform any necessary protocol, timing or other data transformations to convert data signals from one component (e.g., system memory 1920) into a format suitable for use by another component (e.g., processor 1910). In some embodiments, I/O interface 1930 may include support for devices attached through various types of peripheral buses, such as a variant of the Peripheral Component Interconnect (PCI) bus standard or the Universal Serial Bus (USB) standard, for example. In some embodiments, the function of I/O interface 1930 may be split into two or more separate components, such as a north bridge and a south bridge, for example. Also, in some embodiments some or all of the functionality of I/O interface 1930, such as an interface to system memory 1920, may be incorporated directly into processor 1910.

Network interface 1940 may be configured to allow data to be exchanged between computer system 1900 and other devices attached to a network 1985 (e.g., carrier or agent devices) or between nodes of computer system 1900. Network 1985 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 1940 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1950 may, in some embodiments, include one or more display terminals, keyboards, keypads, touchpads, scanning devices, voice or optical recognition devices, or any other devices suitable for entering or accessing data by one or more computer systems 1900. Multiple input/output devices 1950 may be present in computer system 1900 or may be distributed on various nodes of computer system 1900. In some embodiments, similar input/output devices may be separate from computer system 1900 and may interact with one or more nodes of computer system 1900 through a wired or wireless connection, such as over network interface 1940.

As shown in FIG. 19, memory 1920 may include program instructions 1922, which may be processor-executable to implement any element or action described above. In one embodiment, the program instructions may implement the methods described above. In other embodiments, different elements and data may be included. Note that data may include any data or information described above.

Those skilled in the art will appreciate that computer system 1900 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 1900 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1900 may be transmitted to computer system 1900 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A non-transitory computer-readable medium storing program instructions that, when executed by one or more processors, cause the one or more processors to:

determine points to be included in a first level of detail for a point cloud for which attribute information is being compressed; and determine points to be included in one or more additional levels of detail for the point cloud for which attribute information is being compressed, wherein to determine the points to be included in the first level of detail and the one or more additional levels of detail, the program instructions cause the one or more processors to:

determine an ordering of the points of the point cloud based on a space filling curve, wherein respective points of the point cloud are assigned to an index that indexes the respective points based on proximities of the respective points to locations along the space filing curve;

sample the index according to a first sampling rate to determine points of the point cloud to be included in the first level of detail; and sample the index according to one or more other sampling rates to determine points of the point cloud to be included in the one or more additional levels of detail;

compress attribute information for the points determined to be included in the first level of detail; and compress attribute information for the points determined to be included in the one or more additional levels of detail.

2. The non-transitory computer-readable medium of claim 1, wherein the program instructions, when executed by the one or more processors cause the one or more processors to:

signal the first sampling rate and the one or more other sampling rates in a bit stream along with the compressed attribute information for the first level of detail and the compressed attribute information for the one or more additional levels of detail.

3. The non-transitory computer-readable medium of claim 1, wherein the program instructions, when executed by the one or more processors cause the one or more processors to:

determine a first sampling order to be used to sample the index according to the first sampling rate to determine the points to be included in the first level of detail;

determine one or more other sampling orders to be used to sample the index according to the one or more other sampling rates to determine the points to be included in the one or more additional levels of detail; and signal the first sampling order and the one or more other sampling orders in a bit stream along with the compressed attribute information for the first level of detail and the compressed attribute information for the one or more additional levels of detail.

4. The non-transitory computer-readable medium of claim 3, wherein the respective sampling rates indicate respective frequencies at which index positions in the index are to be skipped or selected when traversing the index positions according to one of the respective sampling orders to sample the index to determine which points to include in a given level of detail.

5. The non-transitory computer-readable medium of claim 4, wherein the first sampling order and the one or more other sampling orders comprise one or more of:

a forward sampling order;

a reverse sampling order, wherein the index positions are sampled in an opposite direction as the forward sampling order; or an interior out sampling order, wherein the index is sampled from an interior index position in a forward direction towards an end of the index and is sampled from the interior index position in a reverse direction towards a beginning of the index.

6. The non-transitory computer-readable medium of claim 5, wherein the program instructions, when executed on the one or more processors, cause the one or more processors to:

perform a rate distortion optimization analysis for the respective levels of detail to select the respective sampling orders to be used to determine points to be included in the respective levels of detail.

7. The non-transitory computer-readable medium of claim 6, wherein the program instructions, when executed on the one or more processors, cause the one or more processors to:

determine, based on a rate distortion optimization analysis, a first sampling offset to be used as an offset when sampling the index positions according to the first sampling order using the first sampling rate to determine the points to be included in the first level of detail;

determine, based on a rate distortion optimization analysis, one or more other sampling offsets to be used as offsets when sampling the index positions according to the one or more other sampling orders using the one or more other sampling rates to determine points to be included in the one or more additional levels of detail; and signal the first sampling offset and the one or more other sampling offsets in a bit stream along with the compressed attribute information for the first level of detail and the compressed attribute information for the one or more additional levels of detail.

8. The non-transitory computer-readable medium of claim 7, wherein, for the first level of detail and the one or additional levels of detail, the signaled bit stream comprises one or more different respective:

sampling rates;

sampling orders; or sampling offsets, for use in determining the points to be included in the respective ones of the levels of detail.

9. The non-transitory computer-readable medium of claim 8, wherein the program instructions, when executed by the one or more processors, cause the one or more processors to:

interleave compressed attribute value information between different ones of the levels of detail, such that an attribute value type not included in a given level of detail is included in an adjacent level of detail.

10. The non-transitory computer-readable medium of claim 1, wherein the program instructions, when executed on the one or more processors, cause the one or more processors to:

determine points to be included in another level of detail based on a rate distortion optimization analysis that selects between a nearest neighboring point traversal technique to determine which points to include the other level of detail and a space filling curve sampling technique to determine which points to include in the other level of detail.

11. The non-transitory computer-readable medium of claim 1, wherein the space filling curve is a Morton space filling curve and the ordering of the points in the index is according to a Morton order.

12. A non-transitory computer-readable medium storing program instructions that, when executed by one or more processors, cause the one or more processors to:

determine points to be included in one or more levels of detail for a point cloud, wherein to determine the points to be included in the one or more levels of detail, the program instructions cause the one or more processors to:
  determine an ordering of the points of the point cloud based on a space filling curve, wherein respective points of the point cloud are assigned to an index that indexes the respective points based on proximities of the respective points to locations along the space filing curve; and
  sample the index according to one or more sampling rates to determine points of the point cloud to be included in the one or more levels of detail; and
determine attribute values for the points determined to be included in the one or more levels of detail based on compressed attribute information for the respective one or more levels of detail of the point cloud.

13. The non-transitory computer-readable medium of claim 12, wherein the program instructions, when executed by the one or more processors, enable the one or more processors to receive one or more:
  sampling rates;
  sampling orders; or
  sampling offsets,
for use in determining the points to be included in the respective one or more levels of detail.

14. The non-transitory computer-readable medium of claim 13, wherein for at least one of the levels of detail a sampling, rate, a sampling order, or a sampling offset is signaled to be used for the at least one level of detail that is different from a sampling rate, sampling order, or sampling offset to be used for other ones of the one or more levels of detail.

15. The non-transitory computer-readable medium of claim 12, wherein to determine the attribute values for the points determined to be included in the one or more levels of detail, the program instructions cause the one or more processors to:
  determine a set of neighborhood points for a given point being evaluated based on the determined ordering of the points, wherein the set of neighborhood points comprises a number of points included in the ordering at preceding or subsequent index positions in the ordering that precede or follow the given point being evaluated;
  determine from the set of neighborhood points, a sub-set of the neighborhood points that are nearest in location in three-dimensional space to the given point being evaluated;
  predict an attribute value for the given point being evaluated based on respective attribute values of points included in the sub-set of the neighborhood points that are nearest to the given point being evaluated; and
  apply an attribute correction value for the given point being evaluated to the predicted attribute value to determine a decompressed attribute value for the given point being evaluated, wherein attribute correction values for the respective points of a given level of detail are included in the compressed attribute information for the given level of detail.

16. The non-transitory computer-readable medium of claim 15, wherein the compressed attribute information for two or more levels of detail comprises interleaved compressed attribute value information for the two or more levels of detail, and
  wherein to predict the attribute value for the given point of a given level of detail being evaluated, one or more points in an adjacent level of detail having interleaved attribute information not included for the given point in the given level of detail are considered in making the prediction.

17. The non-transitory computer-readable medium of claim 15, wherein to predict the attribute value for the given point being evaluated, the program instructions cause the one or more processors to:
  predict the attribute value based on:
  the respective attribute values of the points included in the sub-set of neighborhood points that are nearest to the given point being evaluated; and
  a location of the given point being evaluated in a shape of the point cloud formed with other ones of the points of the point cloud.

18. A device, comprising:
  a memory storing program instructions; and
  one or more processors, wherein the program instructions, when executed by the one or more processors, cause the one or more processors to:
    receive spatial information for points of a point cloud;
    receive compressed attribute information for one or more levels of detail of the point cloud;
    determine points to be included in the one or more levels of detail for the point cloud,
    wherein to determine the points to be included in the one or more levels of detail, the program instructions cause the one or more processors to:
      determine an ordering of the points of the point cloud based on a space filling curve, wherein respective points of the point cloud are assigned to an index that indexes the respective points based on proximities of the respective points to locations along the space filing curve; and
      sample the index according to one or more sampling rates to determine points of the point cloud to be included in the one or more levels of detail; and
    determine attribute values for the points determined to be included in the one or more levels of detail based on the received compressed attribute information for the respective one or more levels of detail of the point cloud.

19. The device of claim 18, wherein the program instructions, when executed by the one or more processors, cause the one or more processors to:
  receive a first set of sampling parameters for a first one of the one or more levels of detail; and
  receive a second set of sampling parameters for a second one of the one or more levels of detail,
  wherein the first set of sampling parameters are applied to sample the index to determine the points of the point cloud to include in the first level of detail; and
  wherein the second set of sampling parameters are applied to sample the index to determine the points of the point cloud to include in the second level of detail,
  wherein the first set of sampling parameters and the second set of sampling parameters comprise one or more parameters that are different between the sets.

20. The device of claim 19, wherein the first set of sampling parameters or the second set of sampling parameters comprise one or more of:
  a sampling rate;
  a sampling order; or
  a sampling offset.

* * * * *